US 8,299,511 B2

(12) United States Patent
Tay et al.

(10) Patent No.: US 8,299,511 B2
(45) Date of Patent: *Oct. 30, 2012

(54) LIGHT GUIDE ARRAY FOR AN IMAGE SENSOR

(75) Inventors: Hiok Nam Tay, Singapore (SG);
Thanh-Trung Do, Singapore (SG)

(73) Assignee: CANDELA Microsystems (S) Pte. Ltd., Singapore (SG), part interest ( * ) Notice: Subject to any disclaimer, the term of this patent is extended or adjusted under 35 U.S.C. 154(b) by 0 days.

This patent is subject to a terminal disclaimer.

(21) Appl. No.: 12/894,283

(22) Filed: Sep. 30, 2010

(65) Prior Publication Data

US 2011/0027936 A1 Feb. 3, 2011

Related U.S. Application Data

(63) Continuation of application No. 12/810,998, filed as application No. PCT/US2008/088077 on Dec. 22, 2008, now abandoned.

(60) Provisional application No. 61/069,344, filed on Mar. 14, 2008, provisional application No. 61/063,301, filed on Feb. 1, 2008, provisional application No. 61/062,773, filed on Jan. 28, 2008, provisional application No. 61/009,454, filed on Dec. 28, 2007.

(51) Int. Cl.
*H01L 31/062* (2012.01)

(52) U.S. Cl. ............... 257/291; 257/432; 257/E31.097; 257/E31.127; 438/70

(58) Field of Classification Search .............. 438/48, 438/57, 69, 70; 257/E31.097, E21.11, 290–294, 257/414, 431, 432, E31.127; 250/226; 348/272, 348/273, 275, 280, 281

See application file for complete search history.

(56) References Cited

U.S. PATENT DOCUMENTS

| 5,747,790 A * | 5/1998 | Shimomura et al. ....... 250/208.1 |
| 7,335,963 B2 | 2/2008 | Ford |
| 7,595,215 B2 * | 9/2009 | Park ........................... 438/69 |

(Continued)

FOREIGN PATENT DOCUMENTS

WO WO2009044924 A1 4/2009

OTHER PUBLICATIONS

United Kingdom Patent Application No. GB1012706.6, First Examination Report, Jun. 27, 2011.

(Continued)

*Primary Examiner* — Khiem D Nguyen

(57) ABSTRACT

An image sensor pixel that includes a photoelectric conversion unit supported by a substrate and an insulator adjacent to the substrate. The pixel includes a cascaded light guide that is located within an opening of the insulator and extends above the insulator such that a portion of the cascaded light guide has an air interface. The air interface improves the internal reflection of the cascaded light guide. The cascaded light guide may include a self-aligned color filter having air-gaps between adjacent color filters. These characteristics of the light guide eliminate the need for a microlens. Additionally, an anti-reflection stack is interposed between the substrate and the light guide to reduce backward reflection from the image sensor. Two pixels of having different color filters may have a difference in the thickness of an anti-reflection film within the anti-reflection stack.

14 Claims, 23 Drawing Sheets

U.S. PATENT DOCUMENTS

| | | | |
|---|---|---|---|
| 7,816,641 B2* | 10/2010 | Tay et al. | 250/226 |
| 2005/0236553 A1* | 10/2005 | Noto et al. | 250/208.1 |
| 2006/0081898 A1* | 4/2006 | Wang et al. | 257/291 |
| 2008/0049126 A1* | 2/2008 | Ford et al. | 348/294 |
| 2008/0185500 A1* | 8/2008 | Toshikiyo | 250/208.1 |
| 2010/0155870 A1* | 6/2010 | Tay et al. | 257/432 |
| 2010/0200738 A1 | 8/2010 | Yamashita | |

OTHER PUBLICATIONS

United Kingdom Patent Application No. GB1012706.6, Amended Claims, Nov. 4, 2011.
United Kingdom Patent Application No. GB1012706.6, Applicant's Letter of Arguments, Nov. 4, 2011.
United Kingdom Patent Application No. GB1012706.6, Second Examination Report, Jan. 4, 2012.

* cited by examiner

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 2.5% | | 4.0% | 7.0% | 12% | 17% | 22% |
| 2.2 | 2.1% | | | | | | |

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 21% | 26% | 31% | 35% | 40% | 44% | 48% |
| 2.2 | 17% | 21% | 25% | 29% | 33% | 37% | 40% |
| 2.8 | 14% | 17% | 20% | 23% | 27% | 30% | 33% |
| 4 | 10% | 12% | 14% | 17% | 19% | 21% | 23% |
| 5.6 | 7.0% | 8.7% | 10% | 12% | 14% | 15% | 17% |

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 0.52% | 0.54% | 1.2% | 2.5% | 4.6% | 7.2% | 10.3% |
| 2.2 | 0.43% | 0.45% | 1.0% | 2.1% | 3.8% | 6.1% | 8.7% |
| 2.8 | 0.34% | 0.36% | 0.81% | 1.6% | 3.1% | 4.9% | 7.0% |
| 4 | 0.24% | 0.25% | 0.58% | 1.2% | 2.2% | 3.5% | 5.0% |
| 5.6 | 0.18% | 0.18% | 0.42% | 0.85% | 1.6% | 2.5% | 3.7% |

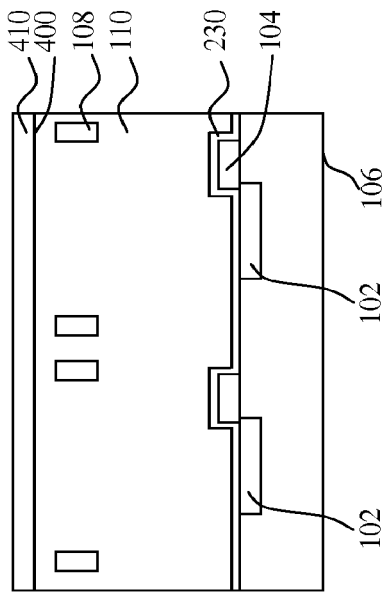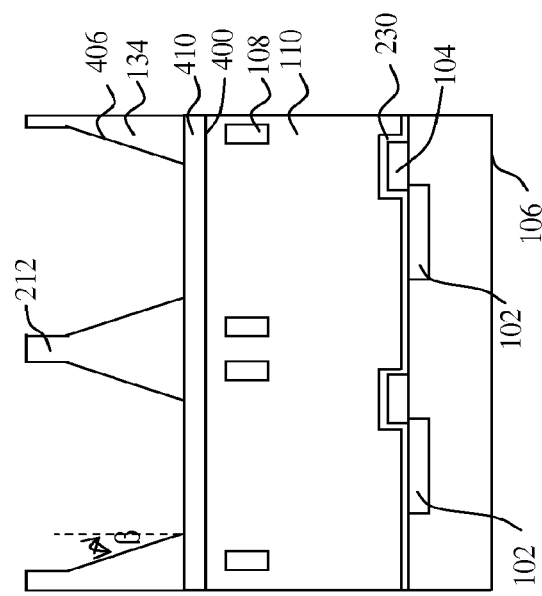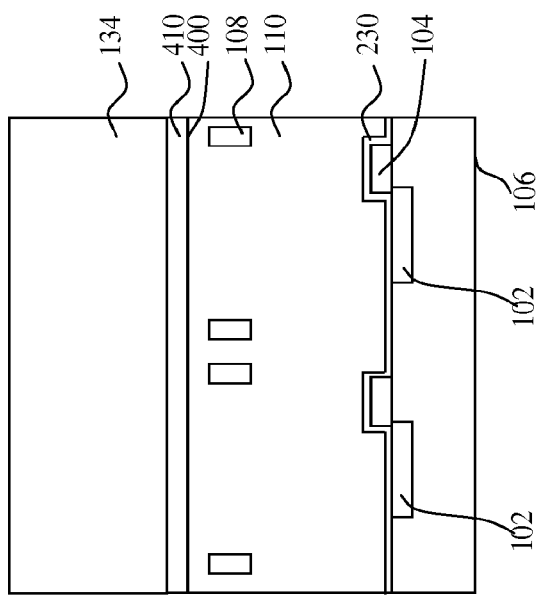

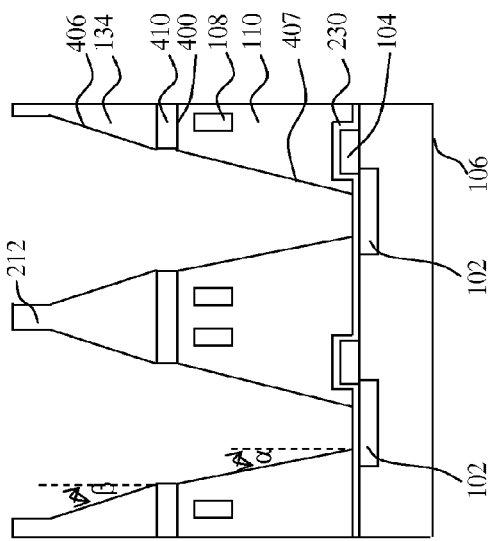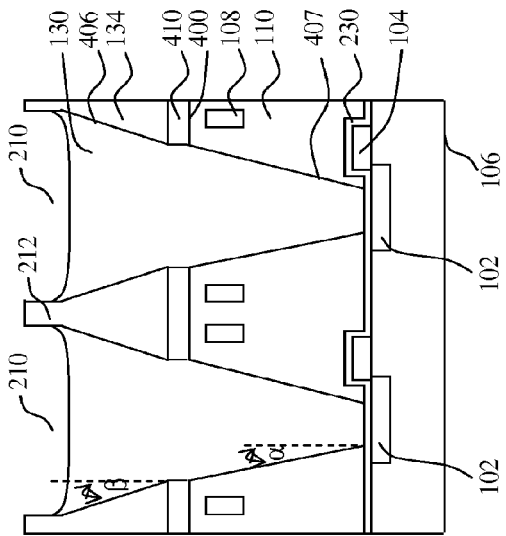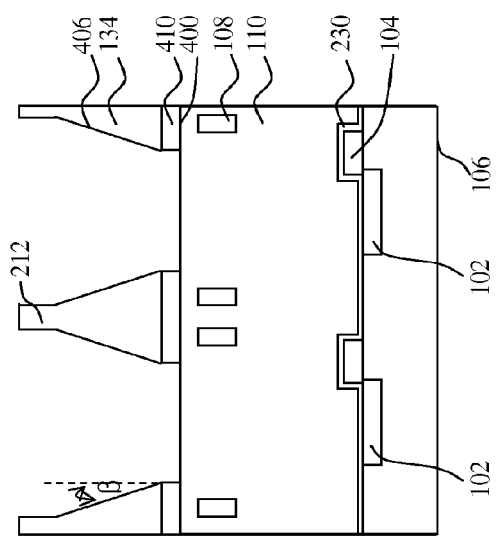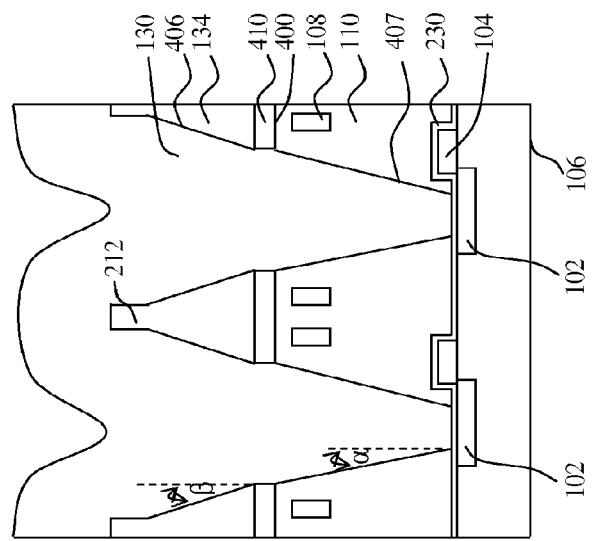

LIGHT GUIDE ARRAY FOR AN IMAGE SENSOR

REFERENCE TO RELATED APPLICATIONS

This application is a continuation of U.S. patent application Ser. No. 12/810,998 filed on Jun. 28, 2010 now abandoned, which is a National Stage Entry of International Patent Application PCT/US08/088077, filed on Dec. 22, 2008, which claims priority to U.S. patent application Ser. No. 12/218,749 filed on Jul. 16, 2008, now U.S. Pat. No. 7,816,641 issued on Oct. 19, 2010; Application No. 61/009,454 filed on Dec. 28, 2007; Application No. 61/062,773 filed on Jan. 28, 2008; Application No. 61/063,301 filed on Feb. 1, 2008; Application No. 61/069,344 filed on Mar. 14, 2008; and application Ser. No. 12/218,749 filed on Jul. 16, 2008.

BACKGROUND OF THE INVENTION

1. Field of the Invention

The subject matter disclosed, generally relates to structures and methods for fabricating solid state image sensors.

2. Background Information

Photographic equipment such as digital cameras and digital camcorders may contain electronic image sensors that capture light for processing into still or video images. Electronic image sensors typically contain millions of light capturing elements such as photodiodes.

Solid state image sensors can be either of the charge coupled device (CCD) type or the complimentary metal oxide semiconductor (CMOS) type. In either type of image sensor, photo sensors are formed in a substrate and arranged in a two-dimensional array. Image sensors typically contain millions of pixels to provide a high-resolution image.

FIG. 1A shows a sectional view of a prior art solid-state image sensor 1 showing adjacent pixels in a CMOS type sensor, reproduced from U.S. Pat. No. 7,119,319. Each pixel has a photoelectric conversion unit 2. Each conversion unit 2 is located adjacent to a transfer electrode 3 that transfers charges to a floating diffusion unit (not shown). The structure includes wires 4 embedded in an insulating layer 5. The sensor typically includes a flattening layer 6 below the color filter 8 to compensates for top surface irregularities due to the wires 4, since a flat surface is essential for conventional color filter formation by lithography. A second flattening layer 10 is provided above the color filter 8 to provide a flat surface for the formation of microlens 9. The total thickness of flattening layers 6 and 10 plus the color filter 8 is approximately 2.0 um.

Light guides 7 are integrated into the sensor to guide light onto the conversion units 2. The light guides 7 are formed of a material such as silicon nitride that has a higher index of refraction than the insulating layer 5. Each light guide 7 has an entrance that is wider than the area adjacent to the conversion units 2. The sensor 1 may also have a color filter 8 and a microlens 9.

The microlens 9 focuses light onto the photo photoelectric conversion units 2. As shown in FIG. 1B because of optical diffraction, the microlens 9 can cause diffracted light that propagates to nearby photoelectric conversion units and create optical crosstalk and light loss. The amount of cross-talk increases when there is a flattening layer above or below the color filter, positioning the microlens farther away from the light guide. Light can crosstalk into adjacent pixels by passing through either flattening layer (above or below color filter) or the color filter's sidewall. Metal shields are sometimes integrated into the pixels to block cross-talking light. In addition, alignment errors between microlens, color filter, and light guide also contribute to crosstalk. The formation, size, and shape of the microlens can be varied to reduce crosstalk. However, extra cost must be added to the precise microlens forming process, and crosstalk still cannot be eliminated.

Backward reflection from the image sensor at the substrate interface is another issue causing loss of light reception. As shown in FIG. 1A, the light guide is in direct contact with the silicon. This interface can cause undesirable backward reflection away from the sensor. Conventional anti-reflection structures for image sensors include the insertion of a oxide-plus-nitride dual-layer film stack directly above the silicon substrate, or a oxynitride layer having variation of nitrogen-to-oxygen ratio there, but only reduces reflection between the silicon substrate and a tall oxide insulator. This approach is not applicable when the interface is silicon substrate and a nitride light guide.

BRIEF SUMMARY OF THE INVENTION

An image sensor pixel that includes a photoelectric conversion unit supported by a substrate and an insulator adjacent to the substrate. The pixel may have a cascaded light guide, wherein a portion of the cascaded light guide is within the insulator and another portion extends above the insulator. The cascaded light guide may include a self-aligned color filter. The pixel may have an anti-reflection stack between the substrate and the cascaded light guide.

BRIEF DESCRIPTION OF THE DRAWINGS

FIGS. 9A-M are illustrations showing a process used to fabricate the pixels shown in FIG. 8;

DETAILED DESCRIPTION

Figure 1A:
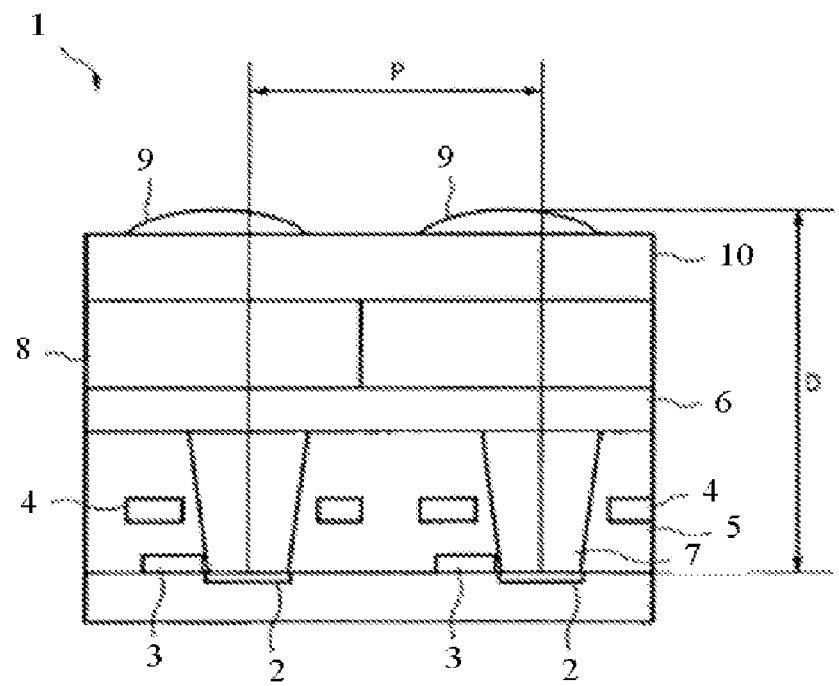
FIG. 1A is an illustration showing a cross-section of two image sensor pixels of the prior art.

Disclosed is an image sensor pixel that includes a photoelectric conversion unit supported by a substrate and an insulator adjacent to the substrate. The pixel includes a light guide that is located within an opening of the insulator and extends above the insulator such that a portion of the light guide has an air interface. The air interface improves the internal reflection of the light guide. Additionally, the light guide and an adjacent color filter are constructed with a process that optimizes the upper aperture of the light guide and reduces crosstalk. These characteristics of the light guide eliminate the need for a microlens. Additionally, an anti-reflection stack is constructed above the photoelectric conversion unit and below the light guide to reduce light loss through backward reflection from the image sensor. Two pixels of different color may be individually optimized for anti-reflection by modifying the thickness of one film within the anti-reflection stack.

The pixel may include two light guides, one above the other. The first light guide is located within a first opening of the insulator adjacent to the substrate. The second light guide is located within a second opening in a support film, which is eventually removed during fabrication of the pixel. A color filter is located within the same opening and thus self-aligns with the second light guide. The second light guide may be offset from the first light guide at the outer corners of the pixel array to capture light incident at a non-zero angle relative to the vertical axis.

An air gap is created between neighboring color filters by removing the support film material adjacent to the filter. Air has a lower refractive index than the support film and enhances internal reflection within the color filter and the light guide. In addition, the air gap is configured to "bend" light incident on the gap into the color filter and increase the amount of light provided to the sensor.

Reflection at the silicon-light-guide interface is reduced by creating a nitride film and a first oxide film below the first light guide. A second oxide film may be additionally inserted below the nitride film to broaden the range of light frequencies for effective anti-reflection. The first oxide film can be deposited into an etched pit before application of the light-guide material. In an alternate embodiment, all anti-reflection films are formed before a pit is etched, and an additional light-guide etch-stop film covers the anti-reflection films to protect them from the pit etchant.

Referring to the drawings more particularly by reference numbers, FIGS. 2, 4A-L, 5 and 6A-B show embodiments of two adjacent pixels in an image sensor 100. Each pixel includes a photoelectric conversion unit 102 that converts photonic energy into electrical charges. In a conventional 4 T pixel, electrode 104 may be a transfer electrode to transfer the charges to a separate sense node (not shown). Alternately, in a conventional 3 T pixel, electrode 104 may be a reset electrode to reset the photoelectric conversion unit 102. The electrodes 104 and conversion units 102 are formed on a substrate 106. The sensor 100 also includes wires 108 that are embedded in an insulating layer 110.

Each pixel has a first light guide 116. The first light guides 116 are constructed with a refractive material that has a higher index of refraction than the insulating layer 110. As shown in FIG. 4B, each first light guide 116 may have a sidewall 118 that slopes at an angle α relative to a vertical axis. The angle α is selected to be less than $90 - \text{asin}(n_{insulating\ layer}/n_{light\ guide})$, preferably 0, so that there is total internal reflection of light within the guide, wherein $n_{insulating\ layer}$ and $n_{light\ guide}$ are the indices of refraction for the insulating layer material and light guide material, respectively. The light guides 116 internally reflect light from the second light guide 130 to the conversion units 102.

The second light guides 130 are located above first light guides 116 and may be made from the same material as the first light guide 116. The top end of the second light guide 130 is wider than the bottom end, where the second light guide 130 meets the first light guide 116. Thus the gap between adjacent second light guides 130 at the bottom (henceforth "second gap") is larger than at the top, as well as larger than the air gap 422 between the color filters 114B, 114G above the second light guides 130. The second light guides 130 may be offset laterally with respect to the first light guides 116 and/or the conversion unit 102, as shown in FIG. 6A, wherein the centerline C2 of the second light guide 130 is offset from the centerline C1 of the first light guide 116 or of the photoelectric conversion unit 102. The offset may vary depending upon the pixel position within an array. For example, the offset may be greater for pixels located at the outer portion of the array. The offset may be in the same lateral direction as the incident light to optimize reception of light by the first light guide. For incident light arriving at a nonzero angle relative to the vertical axis, offset second light guides 130 pass on more light to the first light guides 116. Effectively second light guide 130 and first light guide 116 together constitute a light guide that takes different vertical cross-section shapes at different pixels. The shape is optimized to the incident light ray angle at each pixel.

Figure 5:
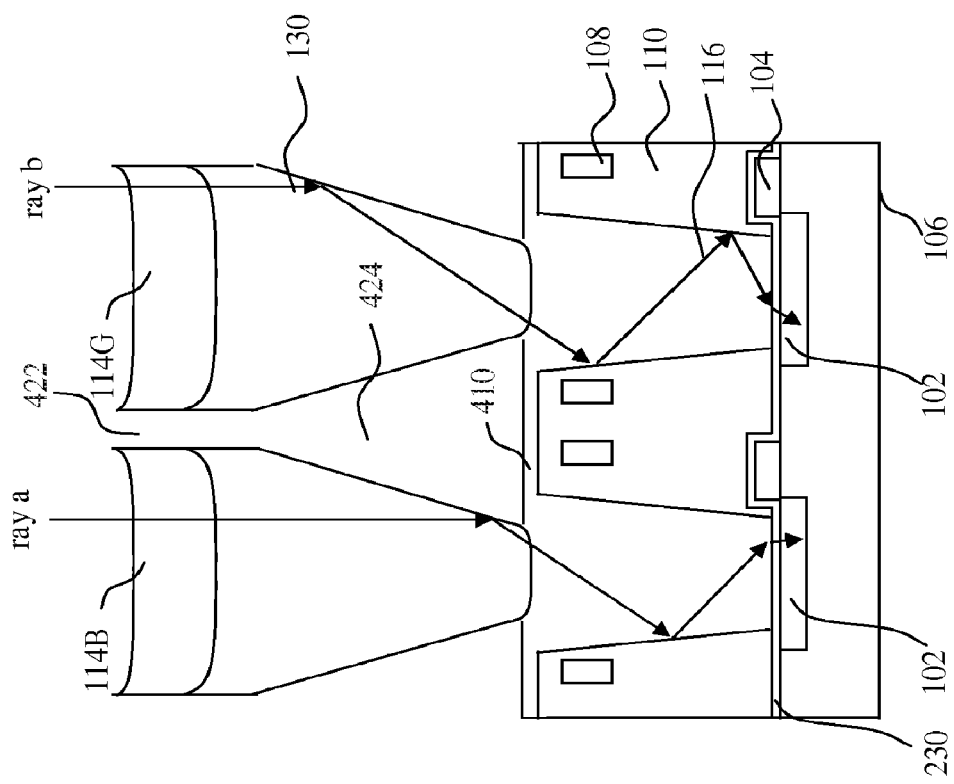
FIG. 5 is an illustration showing ray traces within the pixel of FIG. 2.
Figure 2:
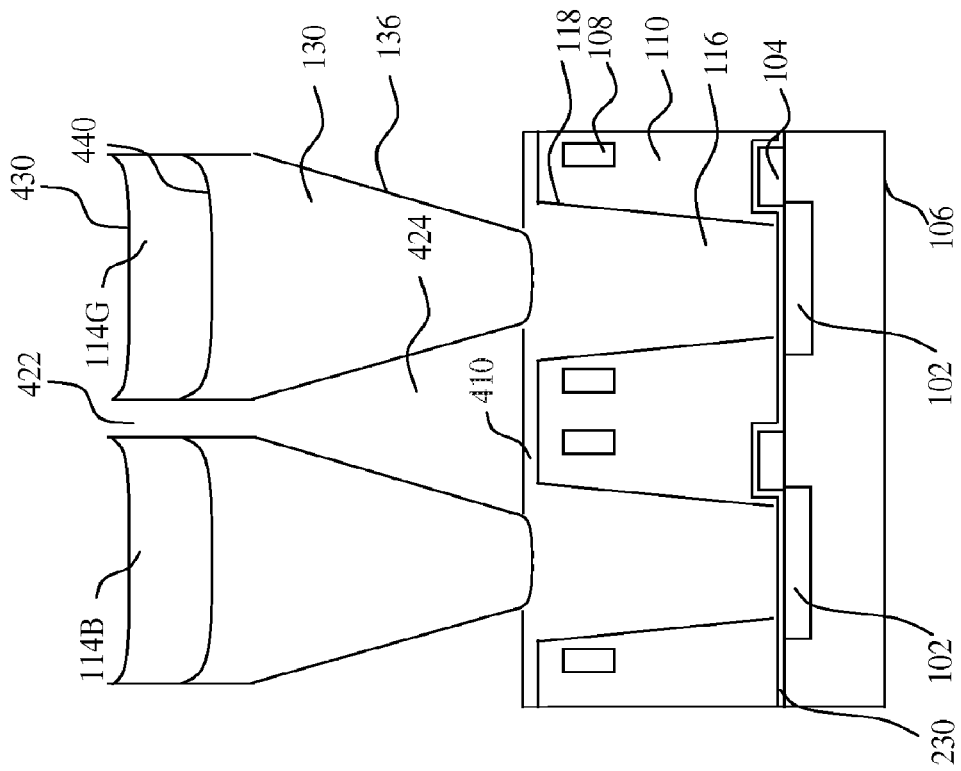
FIG. 2 is an illustration showing a cross-section of two image sensor pixels of the present invention.
Figure 6B:
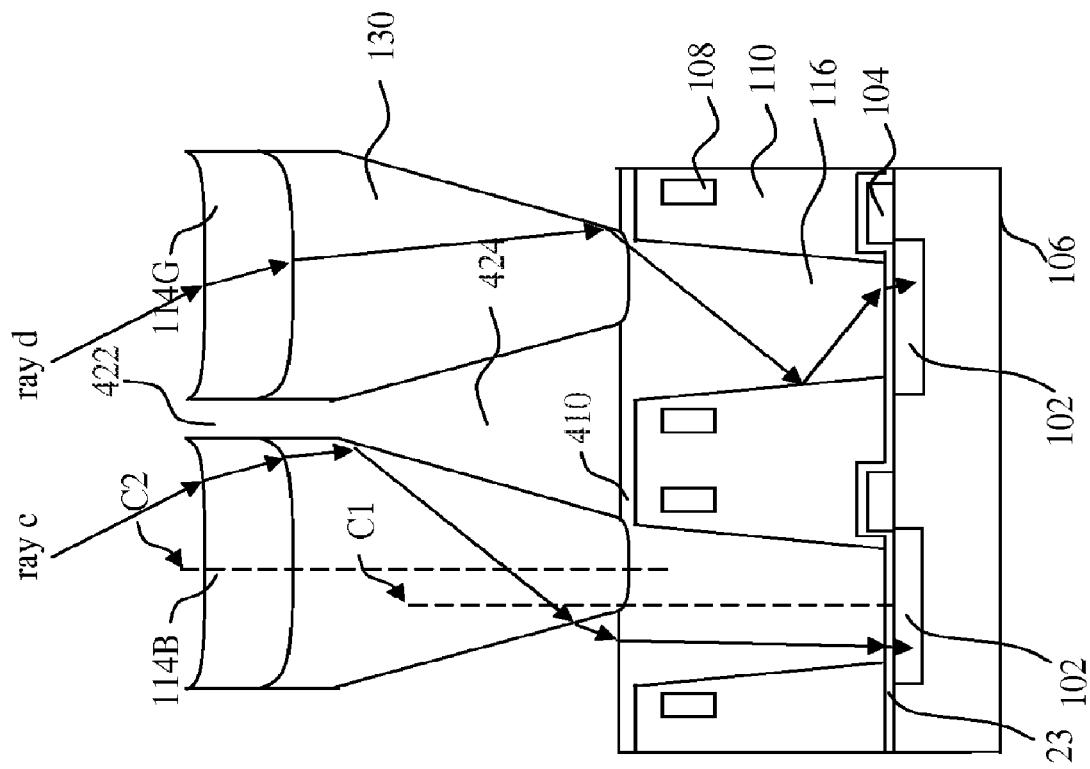
FIG. 6B is an illustration showing light ray traces within the pixel of FIG. 6A.
Figure 6A:
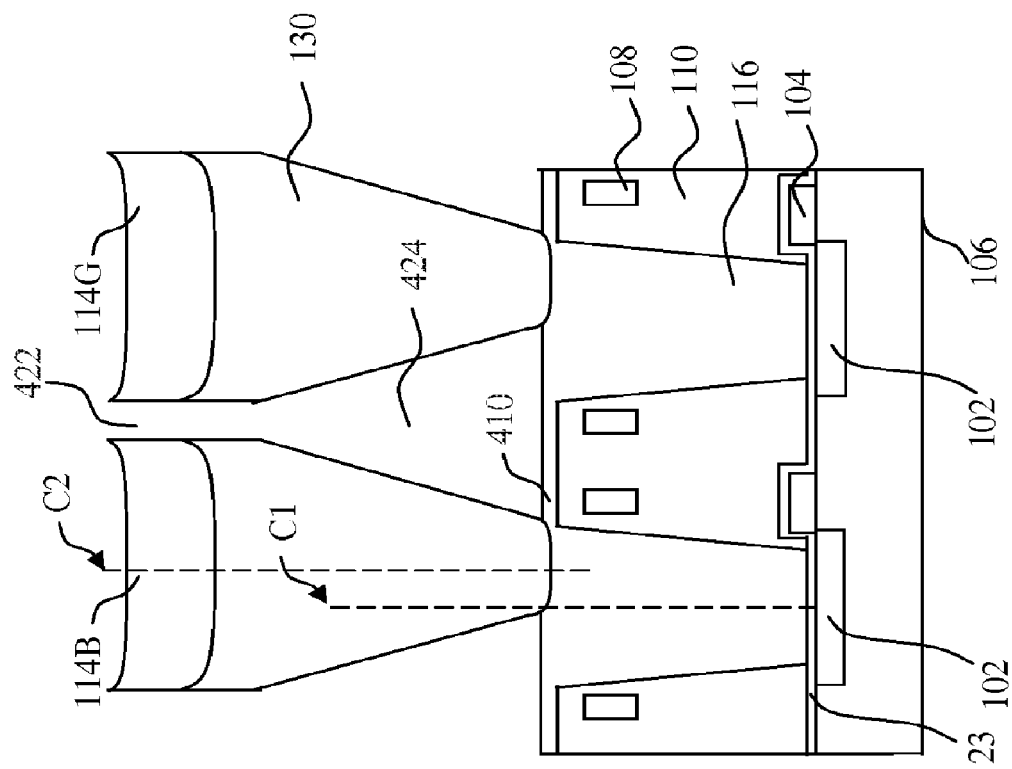
FIG. 6A is an illustration showing a pixel at a corner of the array.

FIGS. 5 and 6B illustrate ray tracing for a pixel at the center of an array and at a corner of the array, respectively. In FIG. 5, incident light rays come in vertically. The second light guides 130 are centered to the first light guides 116. Both light rays a and b reflect once within the second light guide 130 then enter the first light guide 116, reflects once (ray a) or twice (ray b) and then enter conversion units 102. In FIG. 6B, the second light guides 130 are offset to the right, away from the center of the array, which is towards the left. Light ray c, which comes in from the left at an angle up to 25 degrees relative to the vertical axis, reflects off the right sidewall of the second light guide 130, hits and penetrates the lower-left sidewall of the same, enters the first light guide 116, and finally reaches conversion unit 102. The offset is such that the first light guide 116 recaptures the light ray that exits lower-left sidewall of second light guide 130. At each crossing of light guide sidewall, whether exiting the second light guide or entering the first light guide, light ray c refracts in a way that the refracted ray's angle to the vertical axis becomes less each time, enhancing propagation towards the photoelectric conversion unit. Thus, having a light guide built from a first light guide 116 and a second light guide 130 allows the vertical cross-section shape of the light guide to vary from pixel to pixel to optimize for passing light to the photoelectric conversion unit 102.

Building a light guide from two separate light guides 116, 130 has a second advantage of reducing the etch depth for each light guide 116, 130. Consequently, side wall slope angle control can achieve higher accuracies. It also makes deposition of lightguide material less likely to create unwanted keyholes, which often happen when depositing thin film into deep cavities, causing light to scatter from the light guide upon encountering the keyholes.

Color filters 114B, 114G are located above the second light guides 130. The sidewall upper portion at and adjacent to the color filters is more vertical than the rest of second lightguide. Viewing it another way, sidewalls of adjacent color filters facing each other are essentially parallel.

First air-gap 422 between the color filters has a width of 0.45 um or less, and a depth of 0.6 um or greater. An air gap with the dimensional limitations cited above causes the light within the gap to be diverted into the color filters and eventually to the sensors. Thus the percentage loss of light impinging on the pixel due to passing through the gap (henceforth "pixel loss") is substantially reduced.

Figure 3A:
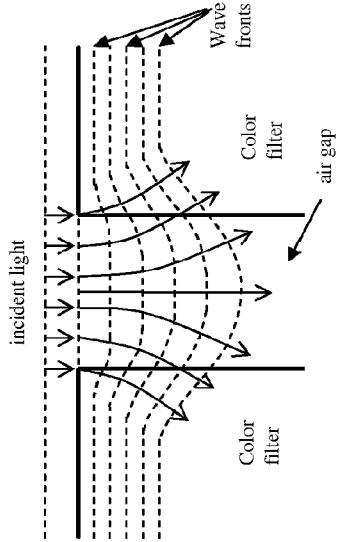
FIG. 3A is an illustration showing light traveling along an air gap between two color filters.
Figure 3B:
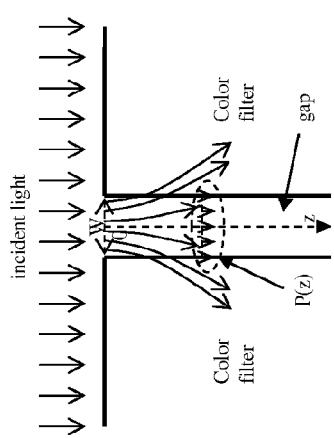
FIG. 3B is an illustration showing the redirection of light from the air gap into the color filters.
Figure 3C:
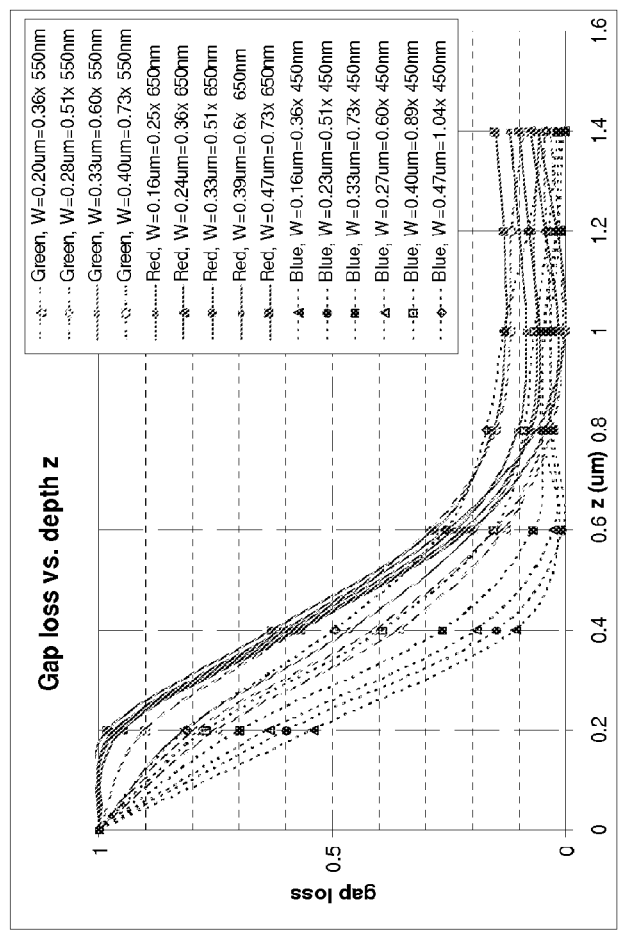
FIG. 3C is a graph of light power versus the distance along the air gap.

Light incident upon a gap between two translucent regions of higher refractive indices become diverted to one or the other when the gap is sufficiently narrow. In particular, light incident upon an air gap between two color filters diverts to one color filter or the other when the gap width is sufficiently small. FIG. 3A shows a vertical gap between two color filter regions filled with a lower refractive index medium, e.g. air. Incident light rays entering the gap and nearer one sidewall than the other is diverted towards and into the former, whereas the rest are diverted towards and into the latter. FIG. 3B shows wavefronts spaced one wavelength apart. Wavefronts travel at slower speed in higher refractive index medium, in this example the color filter having an index n of approximately 1.6. Thus the spacing between wavefronts in the gap, assuming air filled, is 1.6 times that of the color filter, resulting in the bending of wavefronts at the interface between the color filter and air gap and causing the light rays to divert into the color filter. FIG. 3C is a graph of propagated light power P(z) along a vertical axis z of the air gap divided by the incident light power P(0) versus a distance z. As shown by FIG. 3C, light power decreases deeper into the gap for different gap widths, more rapidly for lesser gap widths on the order of one wavelength and converges to be essentially negligible for a gap width of 0.4 times wavelength or less at a depth of 1.5 times wavelength. From FIG. 3C, it is preferable to have a depth equal to at least 1 times the wavelength of the longest wavelength of interest, which is 650 nm in this embodiment for a visible light image sensor. At this depth, the percentage of light power incident upon the gap and lost to the space further below (henceforth "gap loss") is less than 15%. The color filter thus needs to have thickness at least 1 time the wavelength in order to filter incident light entering the gap to prevent unfiltered light from passing on to light guides 130, 114 and eventually to the conversion unit 102. If the gap is filled with a transparent medium other than air, with refractive index $n_{gap}$>1.0, then presumably the gap would need to narrow to 0.45 um/$n_{gap}$ or less, since effectively distances in terms of wavelength remains the same but absolute distances are scaled by 1/$n_{gap}$.

Referring to FIG. 3C, for red light of wavelength in air of 650 nm, at a depth of 0.65 um (i.e. 1.0 time wavelength in air) the gap power flux attenuates to 0.15 (15%) for a gap width of 0.6 time wavelength in air, i.e. 0.39 um. Attenuation reaches maximum at around 1 um of depth. Attenuation is steeper with depth for shorter wavelengths.

Figure 3E:
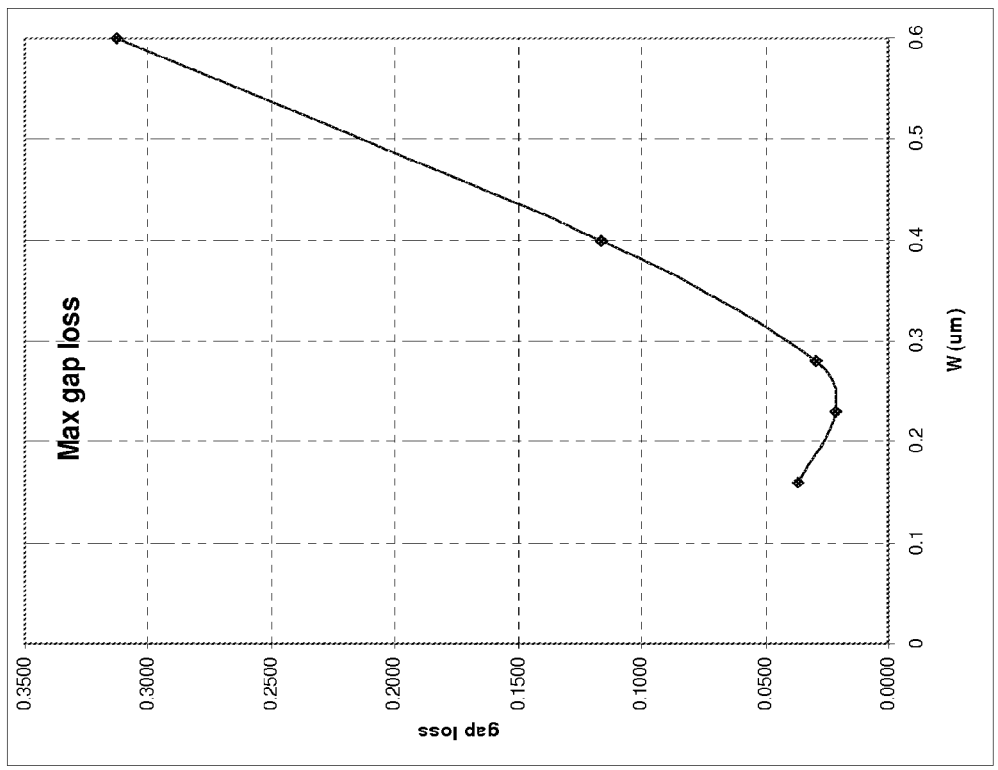
FIG. 3E is a graph of maximal gap power loss versus gap width at a depth of 1.0 um.
Figure 3D:
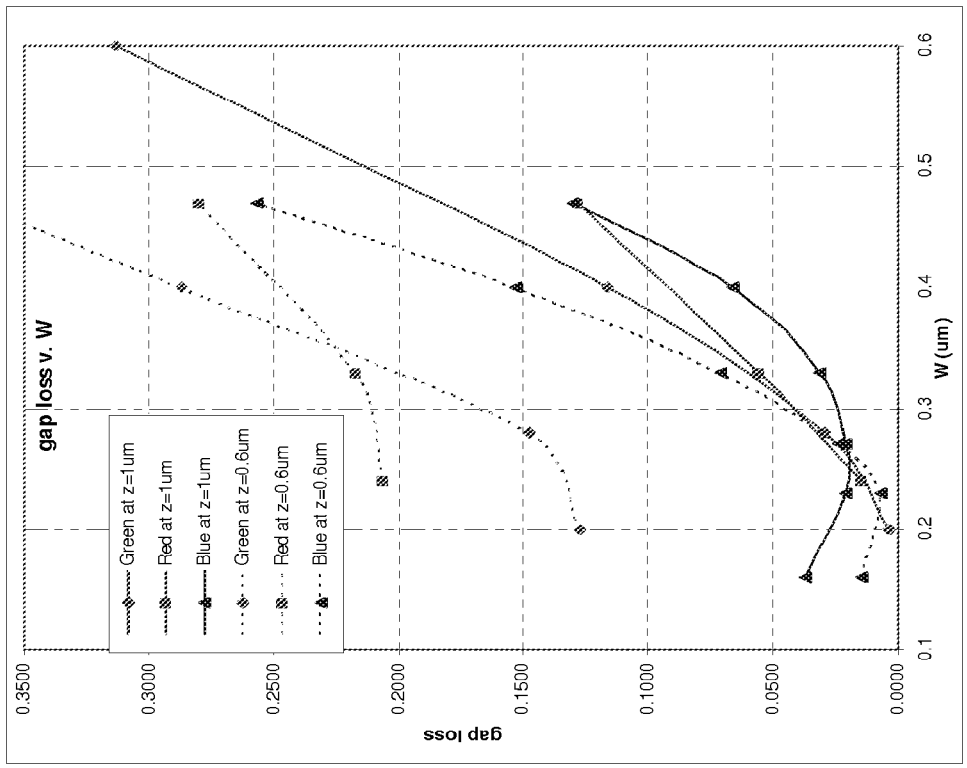
FIG. 3D is a graph of gap power loss versus gap width versus distance along the air gap of widths 0.6 um and 1.0 um for three different colors.
Figures 3F, 3G, 3H, 3I:
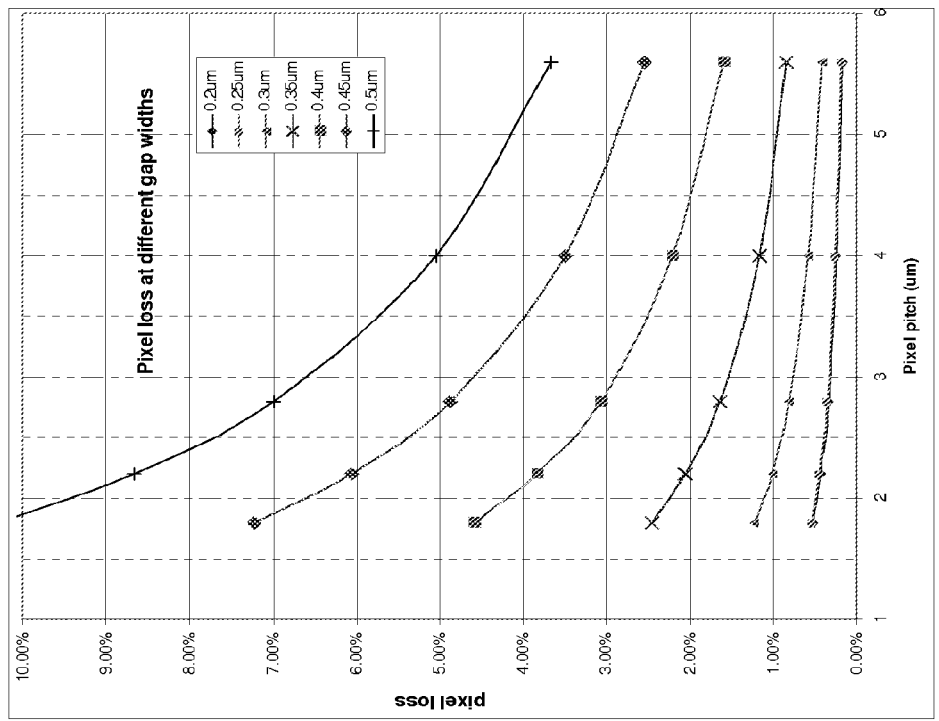
FIG. 3F is a table of maximal gap power loss for different gap widths at a depth of 1.0 um.
FIG. 3G is a table of gap area as percentage of pixel area for different gap widths and different pixel pitches.
FIG. 3H is a table of pixel power loss for different gap widths and different pixel pitches.
FIG. 3I is a graph of pixel power loss versus pixel pitch for different gap widths.

FIG. 3D shows the gap loss versus gap width W for 3 colors—blue at 450 nm wavelength, green at 550 nm, and red at 650 nm—at depths of 0.6 um and 1.0 um, respectively. For a depth of 1.0 um, the highest gap loss among the 3 colors and the maximal gap loss for gap widths of 0.2 um to 0.5 um are plotted in FIG. 3E. Gap loss against gap width is tabulated in FIG. 3F. In FIG. 3G, gap area as percentages of pixel areas is tabulated against pixel pitch and gap width. Each entry (percentage gap area) in the table of FIG. 3G is multiplied with the corresponding column entry (i.e. gap loss) to give pixel loss as tabulated in FIG. 3H. FIG. 3I plots pixel loss versus pixel pitch for different gap widths ranging from 0.2 um to 0.5 um.

FIG. 3I shows that keeping gap width below 0.45 um would result in less than 8% pixel loss for pixel pitch between 1.8 um and 2.8 um—the range of pixel sizes for compact cameras and camera phones—for color filter thickness of 1.0 um. For less than 3%, a gap width below 0.35 um is needed; for less than 1.5%, a gap width below 0.3 um; and for less than 0.5%, a gap width below 0.25 um. FIG. 3I also shows that pixel loss is less for bigger pixels given the same gap width. Thus for pixels larger than 5 um, the above guidelines result in at least halving the pixel loss.

Figure 1B:
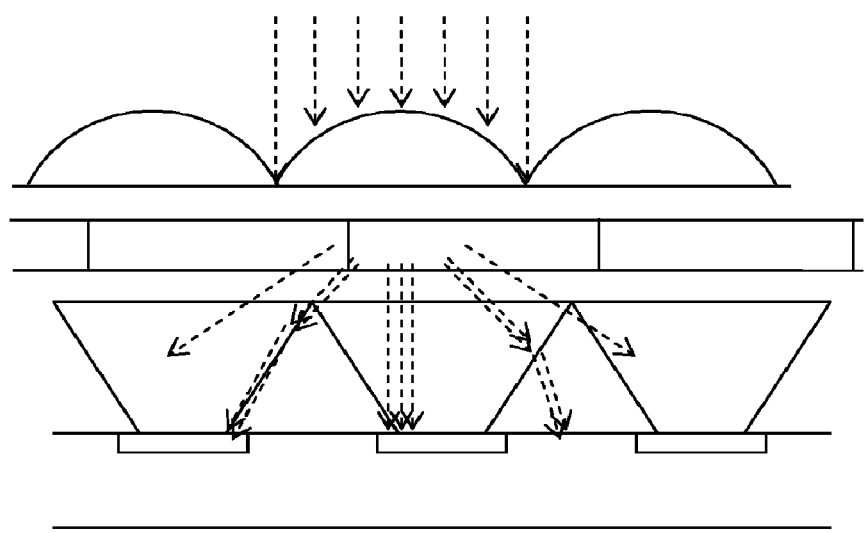
FIG. 1B is an illustration showing light cross-talk between adjacent pixels of the prior art.

Referring to FIGS. 2 and 5 again, it is clear that the first air-gap 422 prevents crosstalk from the color filter of one pixel to an adjacent pixel by internal reflection. Thus the color filters 114B, 114G each functions like a light guide. Together, the color filter, the second light guide, and the first light guide along ray a in FIG. 5 are cascaded together to capture incident light and convey to the photoelectric conversion unit 102 while minimizing loss and crosstalk. Unlike prior art which uses metal walls or light absorbing walls between color filters to reduce crosstalk, at the expense of losing light that impinging on such walls, the first air-gap 422 achieves negligible gap loss by diverting light to the nearest color filter. And since there is no underlying flattening layer below the color filters that bridges between adjacent light guides like in prior art (see FIG. 1B), the associated crosstalk is also eliminated.

Air interface may continue from the color filter sidewall along the second light guide sidewall and end above protection film 410, creating a second air gap 424. The air interface between second air gap 424 and the second light guide 130 enhances internal reflection for the second light guide 130.

A protection film 410 may be formed above insulating layer 110 of silicon nitride to prevent alkali metal ions from getting into the silicon. Alkali metal ions, commonly found in color filter materials, can cause instability in MOS transistors. Protection film 410 also keeps out moisture. The protection film 410 may be made of silicon nitride (Si3N4) of thickness between 10,000 Angstroms and 4,000 Angstroms, preferably 7,000 Angstroms. If either first light guide 116 or second light guide 130 is made of silicon nitride, the protection film 410 which is formed of silicon nitride is continuous across and above the insulating layer 110 to seal the transistors from alkali metal ions and moisture. If both first 116 and second 130 light guides are not made of silicon nitride, the protection film 110 may cover the top surface of the first light guide 116 to provide similar sealing or, alternatively, cover the sidewalls and bottom of first light guide 116.

First 422 and second 424 air gaps together form a connected opening to air above the top surface of the image sensor. Viewing this in another way, there exists a continuous air interface from the protection film 410 to the top surfaces of the color filters 114B, 114G. In particular, there is an air-gap between the top surfaces 430 of the pixels. The existence of this opening during manufacture allows waste materials formed during the forming of first air gap 422 and second air gap 424 to be removed during the manufacture of the image sensor. If for some reason the first air-gap 422 is sealed subsequently using some plug material, this plug material should have a refractive index lower than the color filter material so that (i) there is internal reflection within the color filter, and (ii) light incident within the air-gap 422 is diverted into the color filters 114B, 114G. Likewise if some fill material fills the second air gap 424, this fill material needs to have a lower refractive index than the second light guide 130.

Together, the color filter 114 and light guides 130 and 116 constitute a "cascaded light guide" that guides light to the photoelectric conversion unit 102 by utilizing total internal reflection at the interfaces with external media such as the insulator 110 and air gaps 422 and 424. Unlike prior art constructions, light that enters the color filter does not cross over to the color filter of the next pixel but can only propagate down to the second light guide 130. This makes it unnecessary to have a microlens above to focus light to the center of the pixel area to prevent light ray passing out from a color filter of a pixel to an adjacent pixel. Doing away with microlens has a benefit of eliminating the aforementioned problem of alignment error between microlens and color filter that can cause crosstalk, in addition to lowering manufacturing costs.

As mentioned before, a cascaded light guide further holds an advantage over prior art that uses opaque wall material between color filters in that incident light falling into the first air gap 422 between color filters 114B and 114G is diverted to either one, thus no light is lost, unlike prior art pixels where light is lost to the opaque walls between the filters.

An advantage of this color filter forming method over prior art methods is that the color filter sidewall is not defined by the photoresist and dye materials constituting the color filters. In prior art color filter forming methods, the color filter formed must produce straight sidewalls after developing. This requirement places a limit on the selection of photoresist and dye material because the dye must not absorb light to which the photoresist is sensitive, otherwise the bottom of the color filter will receive less light, resulting in color filter that is narrower at its bottom than its top. The present color filter forming method forms the color filter sidewall by the pocket 210 etched into the support film 134 and not relying on the characteristics of the color filter material or the accuracy of lithography, resulting in a cheaper process.

Another advantage over prior art color filter forming methods is that gap spacing control is uniform between all pixels, and highly accurate at low cost. Here, the gap spacing is a combination of the line-width in the single lithography step that etches the openings in the support film, plus the control of sideway etching during dry etch, both easily controlled uniformed and highly accurately without adding cost. If such gaps were to be created by placing 3 color filters of different colors at 3 different lithography steps as in the prior arts, uniformity of gap widths is impossible, the lithography steps become expensive, and sidewall profile control becomes even more stringent.

A cascaded light guide wherein a color filter 114 and a light guide 130 are formed in the same opening in the support film 134 (henceforth "self-aligned cascaded light guide") has an advantage over prior art in that there is no misalignment between the color filter 114 and the light guide 130. The color filter 114 has sidewalls that self-align to sidewalls of the light guide 130.

Figure 4A:
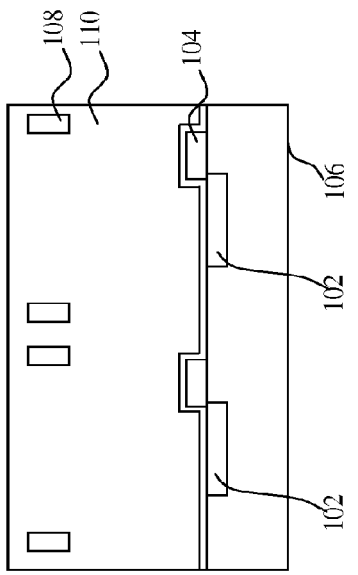
FIGS. 4A-L are illustrations showing a process used to fabricate the pixels shown in FIG. 3.
Figure 4B:
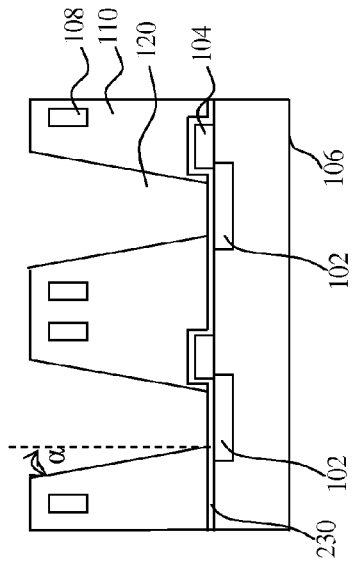

FIGS. 4A-L show a process for forming the image sensor 100. The sensor may be processed to a point wherein the conversion units 102 and electrodes 104 are formed on the silicon substrate 106 and the wires 108 are embedded in the insulator material 110 as shown in FIG. 4A. The insulator 110 may be constructed from a low refractive index ("RI") material such as silicon dioxide (RI=1.46). The top of the insulator 110 can be flattened with a chemical mechanical polishing process ("CMP").

As shown in FIG. 4B, insulating material may be removed to form light guide openings 120. The openings 120 have sloping sidewalls at an angle α. The openings 120 can be formed, by example, using a reactive ion etching ("RIE") process. For silicon oxide as the insulating material, a suitable etchant is $CF_4+CHF_3$ in a 1:2 flow ratio, carried in Argon gas under 125 mTorr, 45° C. The sidewall angle may be adjusted by adjusting the RF power between 300 W and 800 W at 13.56 MHz.

Figure 4C:
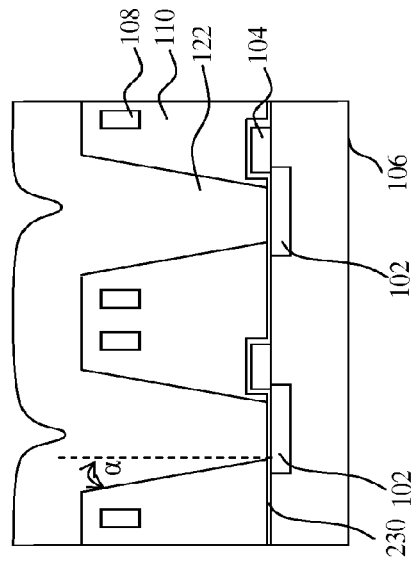

FIG. 4C shows the addition of light guide material 122. By way of example, the light guide material 122 can be a silicon nitride that has an index of refraction of 2.0, greater than the refractive index of the insulating material 110 (e.g. silicon oxide, RI=1.46). Additionally, silicon nitride provides a diffusion barrier against $H_2O$ and alkali metal ions. The light guide material can be added for example by plasma enhanced chemical vapor deposition ("PECVD").

The light guide material may be etched down to leave a thinner and flatter protection film 410 to cover the insulator. This seals the conversion unit 102, gate 104, and electrodes 108 against $H_2O$ and alkali metal ions during the subsequent processes. Alternatively, if the first light guide material 122 is not silicon nitride, a silicon nitride film may be deposited on top of light guide material 122 after an etch-down of the latter to flatten the top surface, to form a protection film 410 that seals the conversion unit 102, gate 104, and electrodes 108 against $H_2O$ and alkali metal ions. The protection film 410 may be between 10,000 Angstroms and 4,000 Angstroms thick, preferably 7,000 Angstroms.

Figure 4D:
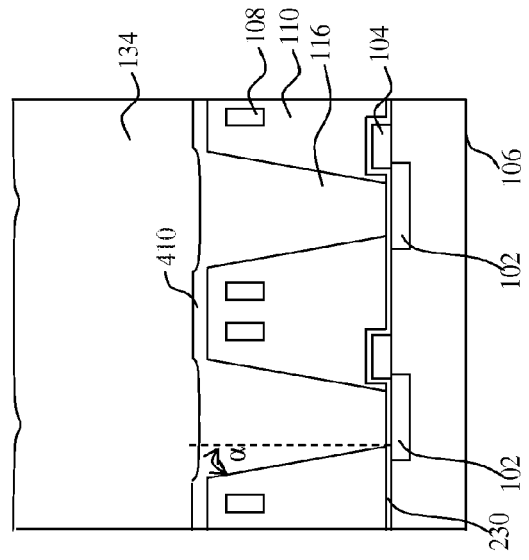

A shown in FIG. 4D a support film 134 is formed on top of the silicon nitride. The support film 134 may be silicon oxide deposited by High Density Plasma ("HDP").

Figure 4E:
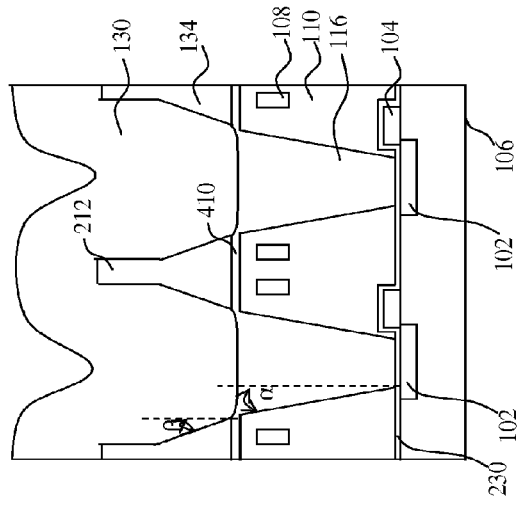

In FIG. 4E, the support film is etched to form openings. The openings may include sidewalls 136 that slope at an angle β. The angle β is selected so that $\beta < 90 - \mathrm{asin}(1/n2_{light\ guide})$, where $n2_{light\ guide}$ is the index of refraction of the second light guide material 130, such that there is a total internal reflection within the second light guides 130. Incorporating two separate lights guides reduces the etching depth for each light guide. Consequently, slope side wall etching is easier to achieve with higher accuracy. The support film 134 and second light guides 130 can be made from the same materials and with the same processes as the insulating layer 110 and first light guides 116, respectively.

As shown in FIG. 4E the sidewall may have a vertical portion and a sloped portion. The vertical portion and sloped portion can be achieved by changing the etching chemistry or plasma conditions during the etching process. The etch recipe during the vertical portion etch is selected to be favorable for forming the vertical sidewall 162, then switched to a recipe favorable for forming the sloped sidewall.

Figure 4F:
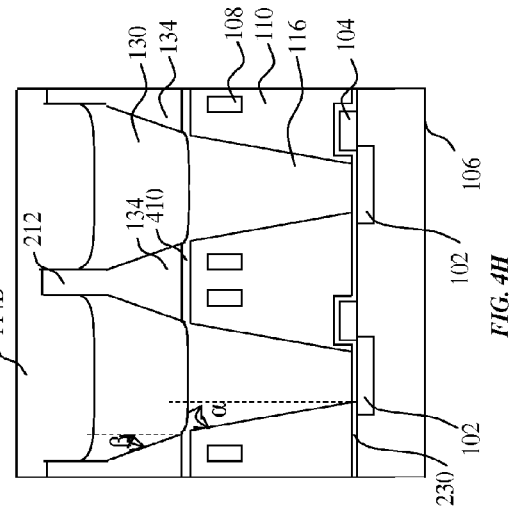

FIG. 4F shows the addition of light guide material. By way of example, the light guide material can be a silicon nitride deposited for example by plasma enhanced chemical vapor deposition ("PECVD").

Figure 4G:
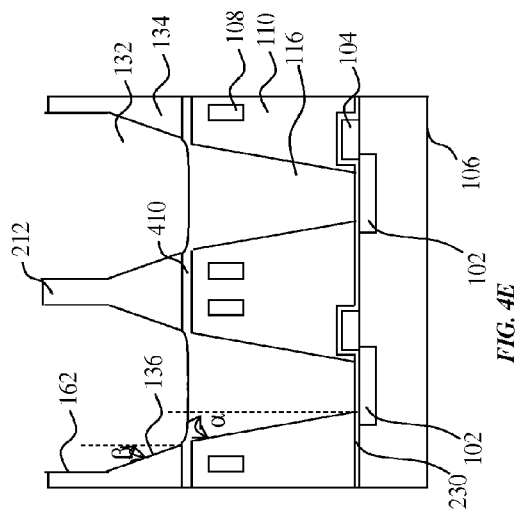

FIG. 4G shows each second light guide 130 has a pocket 210. The pockets 210 are separated by a support wall 212, being part of the support film 134. Pocket 210 is form by etching down light guide material to expose the wall 212 and further till the top surface of light guide is below the top surface of the wall 212 by between 0.6 um to 1.2 um.

Figure 4H:
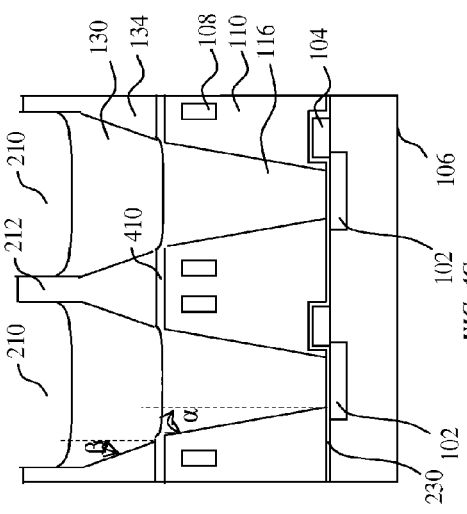

As shown in FIG. 4H, a color film material 114B having a dye of a particular color is applied to fill the pockets 210 and extends above the support film 134. In this example, the color material may contain blue dye. Color filter material is typically made of negative photoresist, which forms polymers that when exposed to light becomes insoluble to a photoresist developer. A mask (not shown) is placed over the material 114B with openings to expose areas that are to remain while the rest is etched away.

Figure 4I:
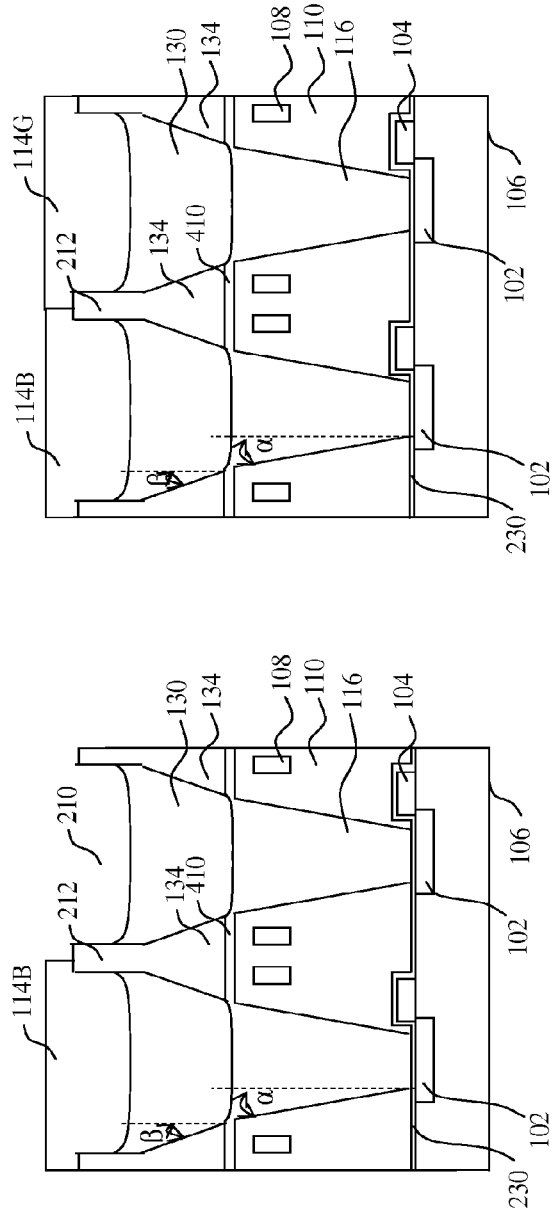
Figure 4J:
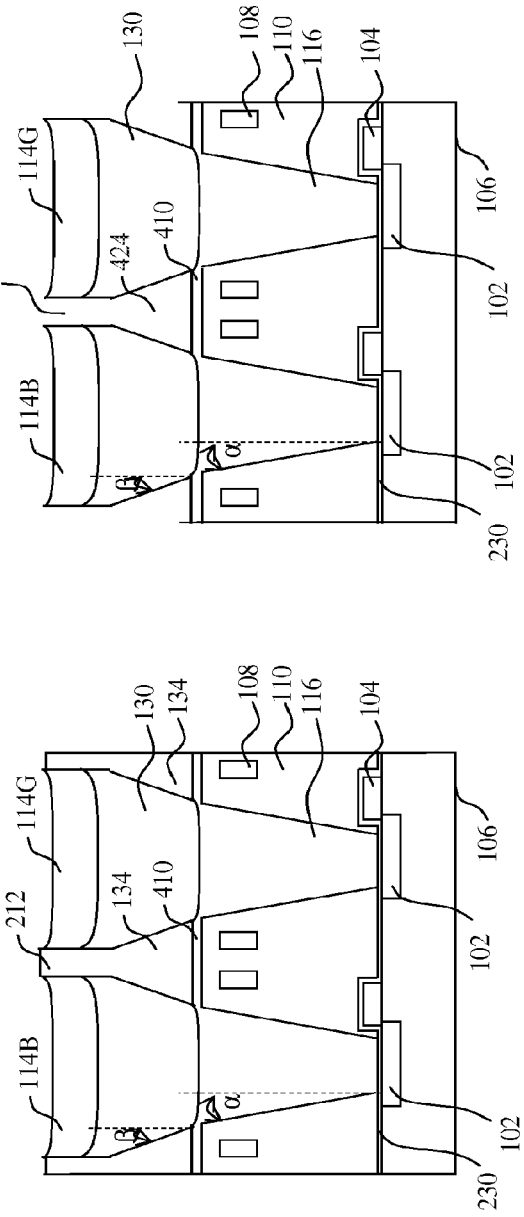

FIG. 4I shows the sensor after the etching step. The process can be repeated with a different color material such as green or red to create color filters for each pixel as shown in FIG. 4J. The last color material applied fills the remaining pockets 210, thus requires no mask step. In other words, exposure light is applied everywhere on the image sensor wafer to exposure the last color filter film everywhere. During the bake step, the last color filter forms a film that overlaps all pixels, include pixels of other colors. The overlap of the last color filter on other pixels is removed during a subsequent color filter etch-down process shown in FIG. 4K.

Referring to FIG. 4G, the pockets 210 provide an self-alignment feature to self-align the color filter material with the second light guide 130. The pockets 210 may be wider than the corresponding mask openings. To reduce the thickness of the support wall 212 for an desired second light guide opening for a given pixel pitch, the pressure in the plasma chamber may be increased to enhance sideway (i.e. isotropic) etch (by increasing ion scattering) to undercut the mask.

Figure 4K:
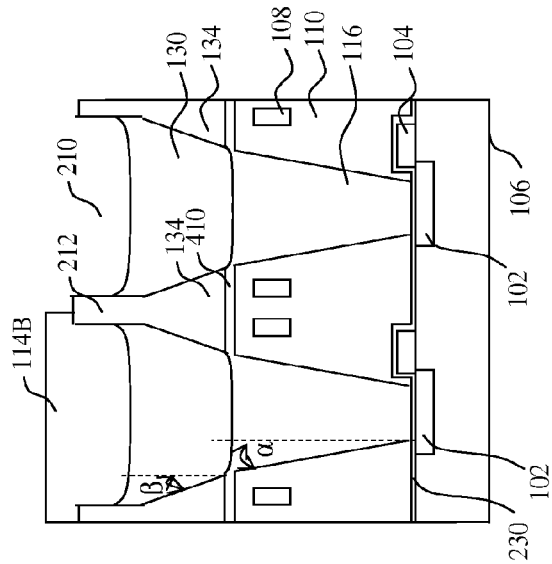
Figure 4L:
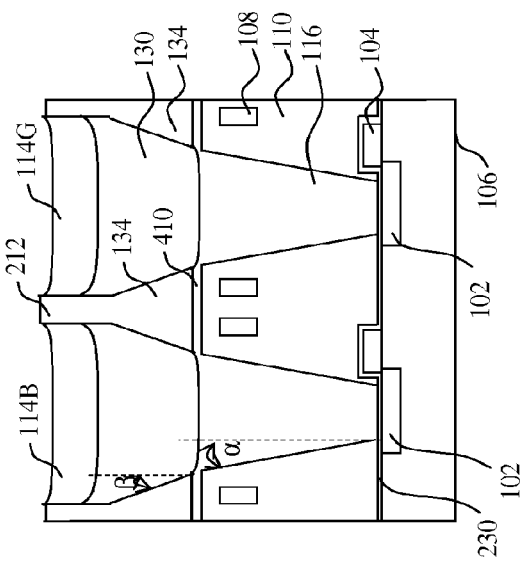
Figure 7:
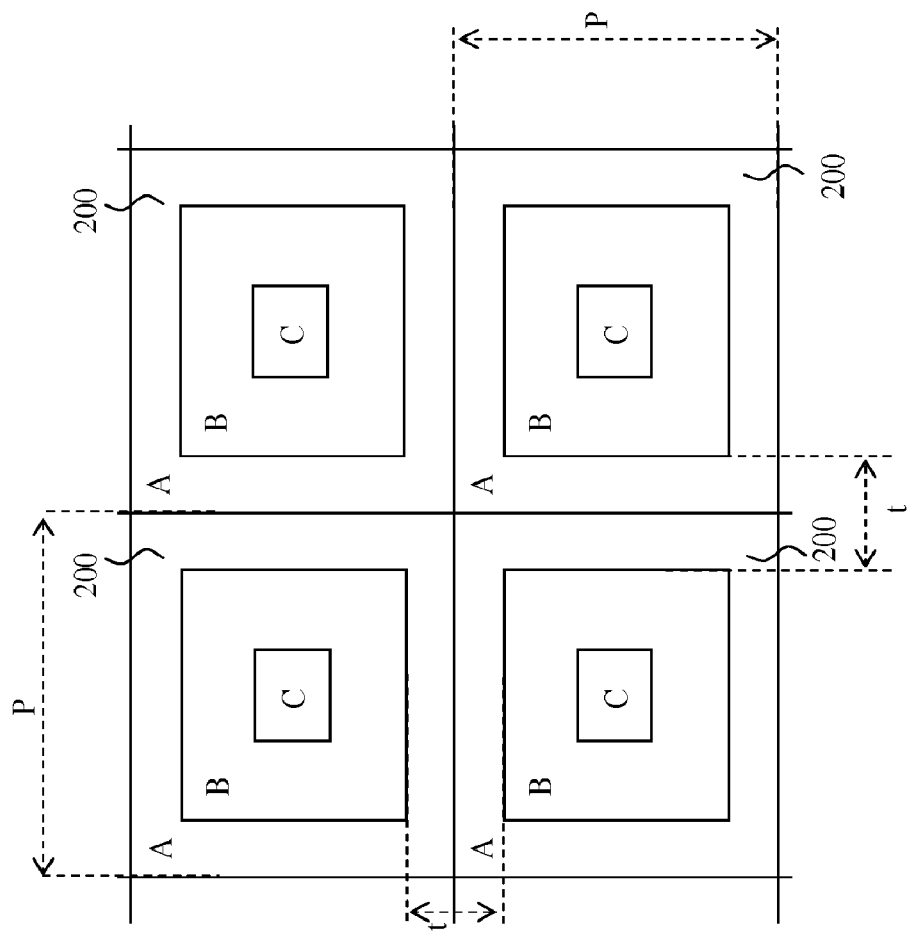
FIG. 7 is an illustration showing a top view of four pixels within an array.

As shown in FIG. 4K the color filters 114B, 114G are etched down to expose the support wall 212, being part of the support film 134. A portion of the support film 134 is then removed as shown in FIG. 4L so that there is an air/material interface for the color filters 114B, 114G. A further portion of the support film 134 may be removed as shown in FIG. 4L so that there is an air/material interface for the second light guide 130 to further aid internal reflection by allowing light rays closer to the perpendiculars to the interface to undergo total internal reflection. The first gap 422 has a width sufficiently small, 0.45 um or less, so that incident red light and light of lesser wavelengths impinging into the first gap 422 is diverted to either color filter 114B or 114G, thus improving light reception. Light internally reflects along the color filters 114B, 114G and light guides 130 and 116. The color filters 114B, 114G have a higher refractive index than air so that the color filters 114B, 114G provides internal reflection. Likewise, the second light guide 130 has an air interface which improves the internal reflection properties of the guide. If the support film 134 is not completely removed, as long as the support film has a lower refractive index (e.g. silicon oxide, 1.46) than the light guide material (e.g. silicon nitride, 2.0), the interface between the second light guide 130 and the support film 134 has good internal reflection. Likewise, the interface between the first light guide 116 and the first insulator film 110 enjoys good internal reflection. FIG. 7 is a top view showing four pixels 200 of a pixel array. For embodiments that include both first and second light guides the area B may be the area of the second light guide top surface and the area C represents the area of the first light guide bottom surface. The area A minus the area B may be the area of the first air gap 422 between color filters.

Figure 8:
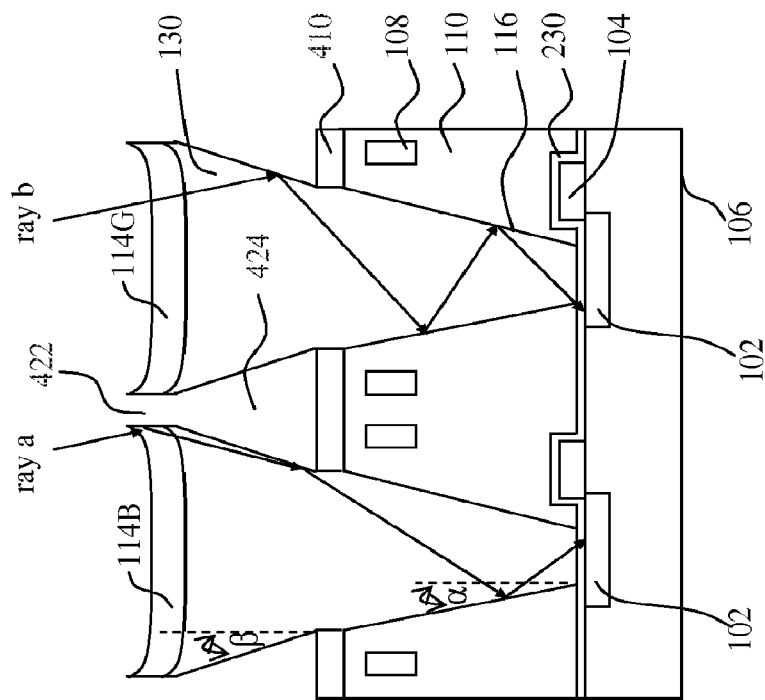
FIG. 8 is an alternate embodiment of the sensor pixels with ray tracing.
Figure 9J:
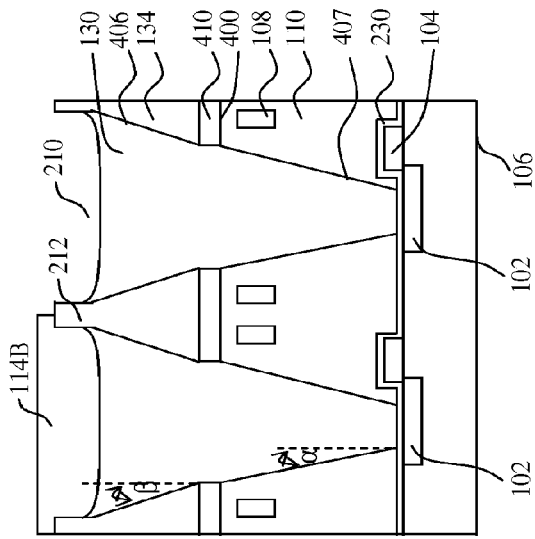
Figure 9L:
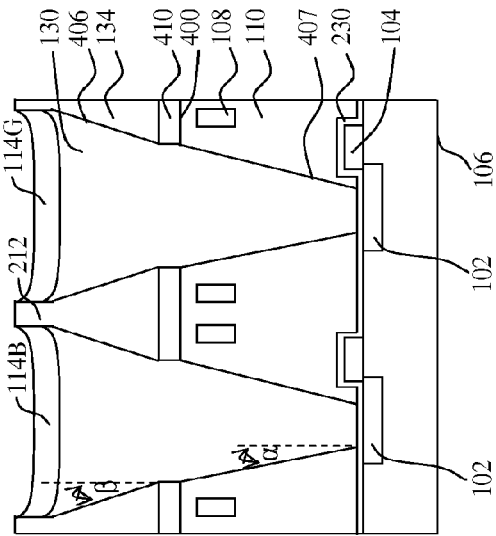
Figure 9I:
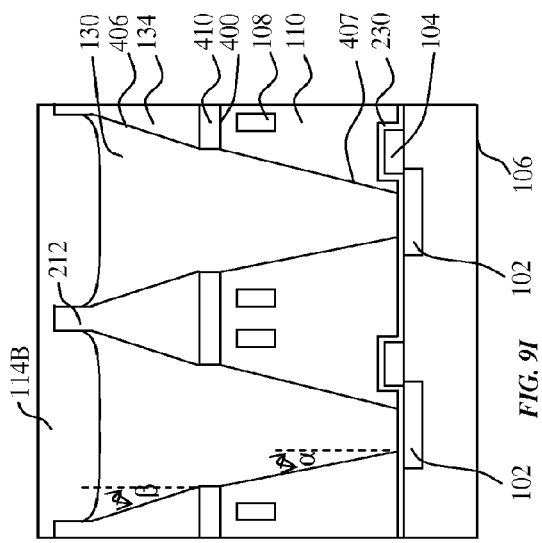
Figure 9K:
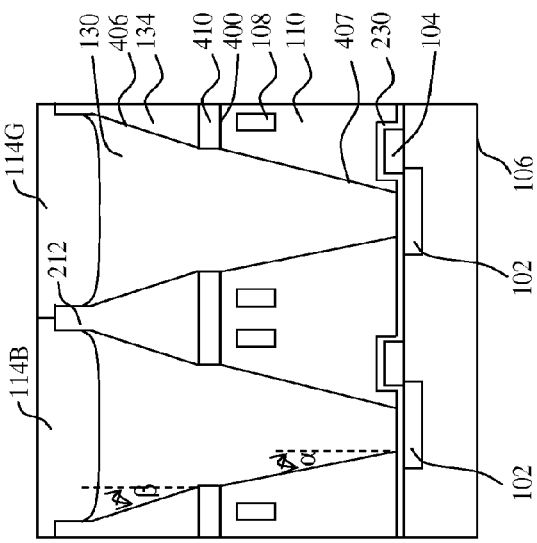
Figure 9M:
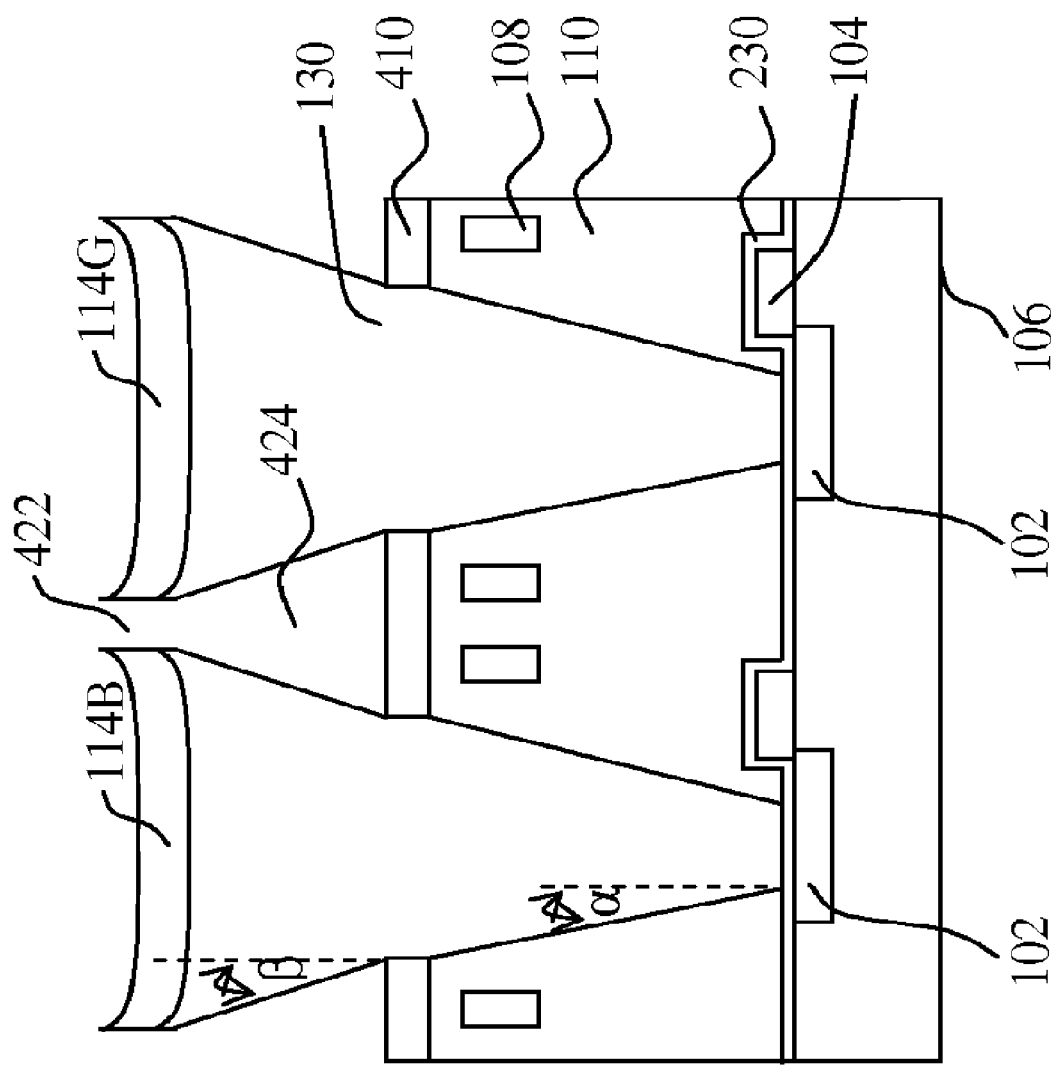

FIG. 8 shows an alternate embodiment wherein the second and first light guides are both etched using the same mask after the support film 134 is formed, and both filled with light guide material in one step. A process for fabricating this alternate embodiment is shown in FIGS. 9A-M. The process is similar to the process shown in FIGS. 4A-L, except the opening for the first light guide is formed after the opening for the second light as shown in FIG. 9F, where no additional mask is needed because the protective film 410 and the support film 134 above act as hard masks to block etchants. Both light guides are filled in the same step shown in FIG. 9G.

Figure 10A:
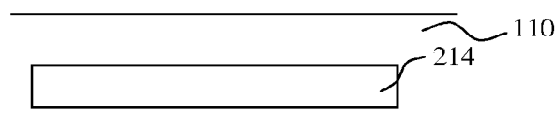
FIGS. 10A-H are illustrations showing a process to expose a bond pad.
Figure 10B:
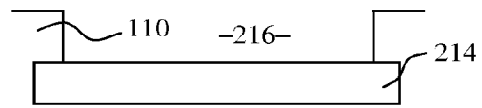
Figure 10C:
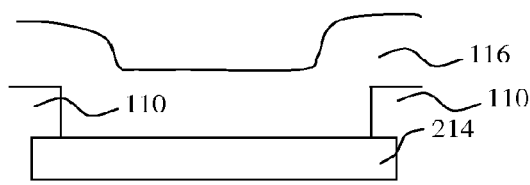
Figure 10D:
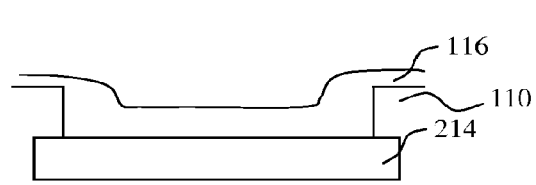
Figure 10E:
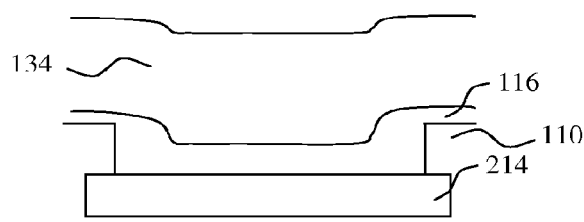
Figure 10F:
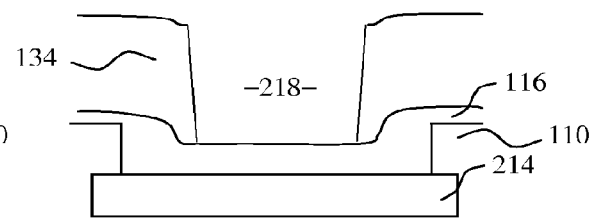
Figure 10G:
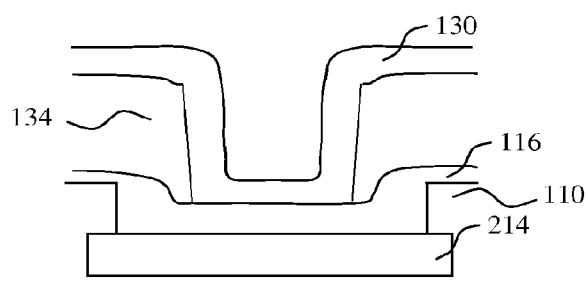
Figure 10H:
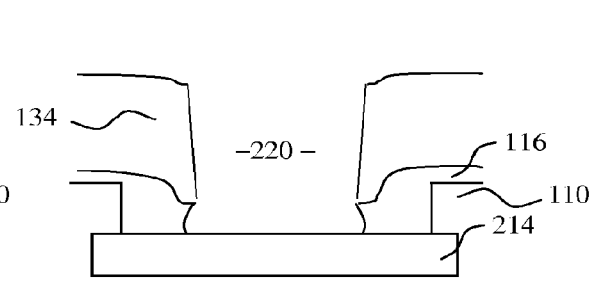

FIGS. 10A-H show a process to expose bond pads 214 of the image sensor. An opening 216 is formed in a first insulator material 110 that covers a bond pad 214 as shown in FIGS. 10A-B. As shown in FIGS. 10C-D the first light guide material 116 is applied and a substantial portion of the material 116 is removed, leaving a thinner layer to seal the first insulator material 110 below. The support film material 134 is applied and a corresponding opening 218 is formed therein as shown in FIGS. 10E-F. The second light guide material 130 is applied as shown in FIG. 10G. As shown in FIG. 10H a maskless etch step is used to form an opening 220 that exposes the bond pad 214. The etchant preferably has a characteristic that attacks light guide material 116 and 130 (e.g. silicon nitride) faster than the insulator material 110 and 134 (e.g. silicon oxide) and color filter 114 (photoresist). Dry etch in $CH_3F/O_2$ has 5×~10× greater etch rate on silicon nitride than on color filter or silicon oxide.

Figure 11:
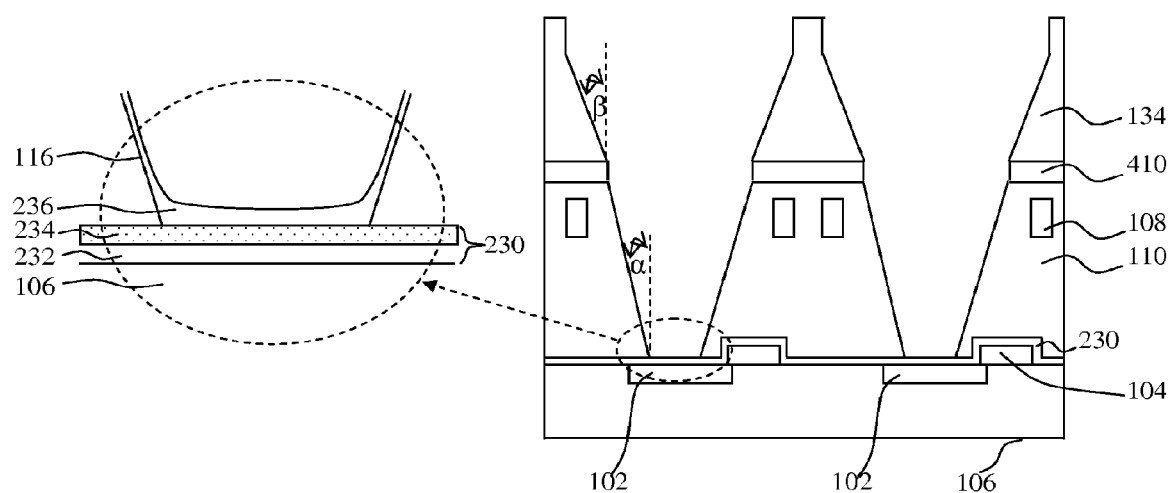
FIG. 11 is an illustration showing an anti-reflection stack within the sensor.

FIG. 11 shows an embodiment wherein an anti-reflection (AR) stack comprising a top AR film 236, a second AR film 234, and a third AR film 236 covers the conversion units 102. The anti-reflection stack improves the transmission of light from the first light guide 116 to the conversion units 102. Members of the AR stack together may constitute layer 230 that also blanket the substrate 106, conversion units 102 and electrodes 104 to protect the elements from chemical pollutants and moisture. For example, the second AR film 234 may be a contact etch-stop nitride film common in CMOS wafer fabrication for stopping the oxide etching of contact holes to prevent over-etch of polysilicon contacts whose contact holes are shallower than source/drain contacts by typically 2,000 Angstroms. The third AR film 232 may be silicon oxide. This silicon oxide film may be a gate insulating film under the gate electrode 114, or the spacer liner oxide film that runs down the side of the gate electrode 114 between the gate and the spacer (not shown) in common deep submicron CMOS processes, a silicide-blocking oxide film deposited before contact silicidation to block contact siliciding, or a combination thereof, or a blanket oxide film deposited after salicide-block oxide etch that etches away all oxide in areas coinciding with the bottom of light guides 116. Using an existing silicon nitride contact etch-stop film as part of the AR stack provides cost savings. The same contact etch-stop film also functions to stop the etch of the opening in insulator 110 for fabrication of the light guide. Finally, the top AR film 236 is formed in the opening in the insulator 110 prior to filling the opening with light guide material.

The top AR film 236 has a lower refractive index than the light guide 116. The second AR film 234 has a higher refractive index than the top AR film 236. The third AR film 232 has a lower refractive index than the second AR film 234.

The top AR film 236 may be silicon oxide or silicon oxynitride, having refractive index about 1.46, with a thickness between 750 Angstrom and 2000 Angstrom, preferably 800 Angstrom. The second AR film 234 may be silicon nitride ($Si_3N_4$), having refractive index about 2.0, with a thickness between 300 Angstrom and 900 Angstrom, preferably 500

Angstrom. The third AR film 232 may be silicon oxide or silicon oxynitride (SiOxNy, where 0<x<2 and 0<y<4/3), having refractive index about 1.46, with a thickness between 25 Angstrom and 170 Angstrom, preferably 75 Angstrom. The third AR film 232 may comprise the gate oxide under the gate 104 and above the substrate 106 of FIG. 2, as shown in FIG. 3 of U.S. Application 61/009,454. The third AR film 232 may further comprise gate liner oxide as shown in FIG. 3 of the same. Alternately, the third AR film 232 may be formed by a blanket silicon oxide deposition everywhere on the wafer after a salicide-block etch removes salicide-block oxide 64, gate-liner oxide 55, and gate-oxide 54 shown in FIG. 2 of U.S. Application 61/009,454 by using a salicide-block-etch mask having a mask opening coinciding with the bottom of light guide 116.

The anti-reflection structure shown in FIG. 11 can be fabricated by first forming the third AR film 232 and the second AR film 234 over the substrate, respectively. The insulator 110 is then formed on the second AR film 234. Silicon nitride film is deposited by PECVD on the first insulator 110 in a manner that covers and seals the insulator and underlying layers to form a protection film 410 with a thickness between 10,000 Angstrom and 4,000 Angstrom, preferably 7,000 Angstrom. The support film 134 is formed on the protection film 410 by, for example, HDP silicon oxide deposition.

The support film 134 is masked and a first etchant is applied to etch openings in the support film 134. The first etchant is chosen to have high selectivity towards the protection film material. For example, if the support film 134 comprises HDP silicon oxide and the protection film 410 comprises silicon nitride, the first etchant may be $CHF_3$, which etches HDP silicon oxide 5 times as fast as silicon nitride. A second etchant is then applied to etch through the silicon nitride protection film 410. The second etchant may be $CH_3F/O_2$. The first etchant is then applied again to etch the first insulator 110 and to stop on the contact etch-stop film 234 which comprises silicon nitride. The contact etch-stop film 234 acts as an etchant stop to define the bottom of the opening. The top AR film 236 is then formed in the opening by anisotropic deposition methods, for example, PECVD or HDP silicon oxide deposition, that deposits predominantly to the bottom of the opening than to the sidewalls. An etchant can be applied to etch away any residual top AR film material that extends along the sidewalls of the opening, for example by dry etch using the first etchant and holding the wafer substrate at a tilt angle and rotated about the axis parallel to the incoming ion beam. Light guide material is then formed in the openings, for example by silicon nitride PECVD. Color filters may be formed over the light guide and a portion of the support film between adjacent color filters and a further portion between adjacent light guides may be etched to create the structure shown in FIG. 5.

Figure 12A:
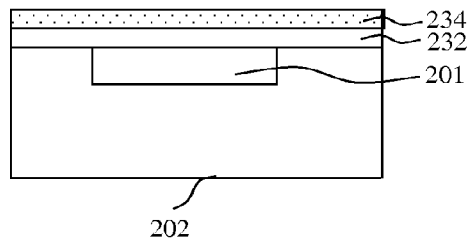
FIGS. 12A-E are illustrations showing an alternate process to form an anti-reflection stack within the sensor.
Figure 12B:
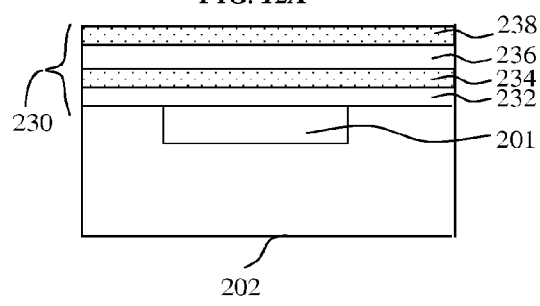
Figure 12C:
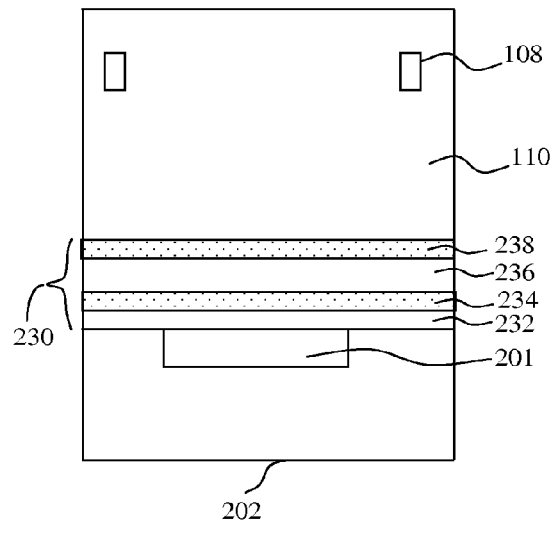
Figure 12D:
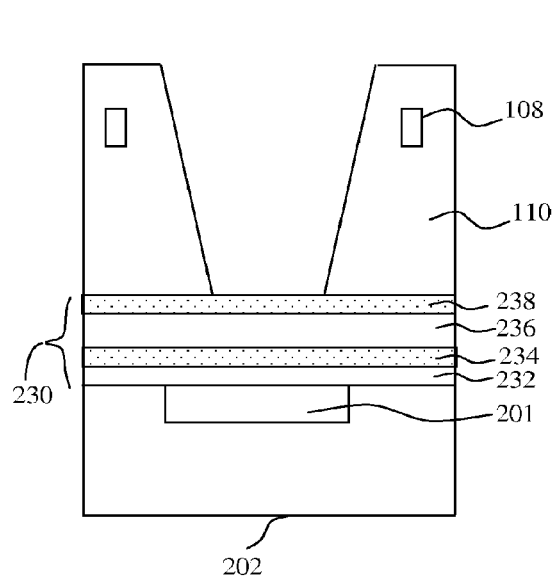
Figure 12E:
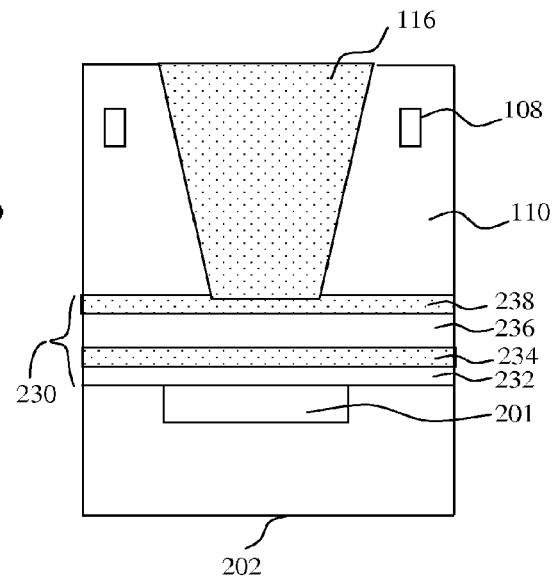

FIGS. 12A-E show a process for fabricating another embodiment of anti-reflection between the light guide 116 and substrate 202. Referring to FIG. 12E, in this embodiment an etch-stop film 238 is interposed between the light guide 116 and the anti-reflection (AR) stack comprising the top AR film 236, second AR film 234, and third AR film 232. The light guide etch-stop film 238 may be formed of the same material as the light guide 116, and may be silicon nitride, with a thickness between 100 Angstrom and 300 Angstrom, preferably 150 Angstrom. Forming the AR stack in this embodiment has an advantage of more precise control of the thickness of the second AR film, at the expense of one more deposition step and the slight added complexity of etching through a oxide-nitride-oxide-nitride-oxide stack instead of oxide-nitride-oxide stack for contact hole openings (not shown). The previous embodiment uses the second AR film 234 as a light guide etch stop and loses some of thickness to the final step of insulator pit etch over-etch.

As shown in FIGS. 12A-B, the third 232 and second 234 AR films are applied to the substrate 106 and then a top AR film 236 is applied onto the second AR film 234, followed by a light guide etch-stop film 238 made of silicon nitride. As shown in FIG. 12C, the insulator layer 110 and wiring electrodes 108 are formed above the AR films 232, 234, and 236, and light guide etch-stop film 238. FIG. 12D shows an opening etched into insulator 110, stopping at the top of the light guide etch-stop film 238. FIG. 12E shows the opening filled with light guide material.

Figure 13A:
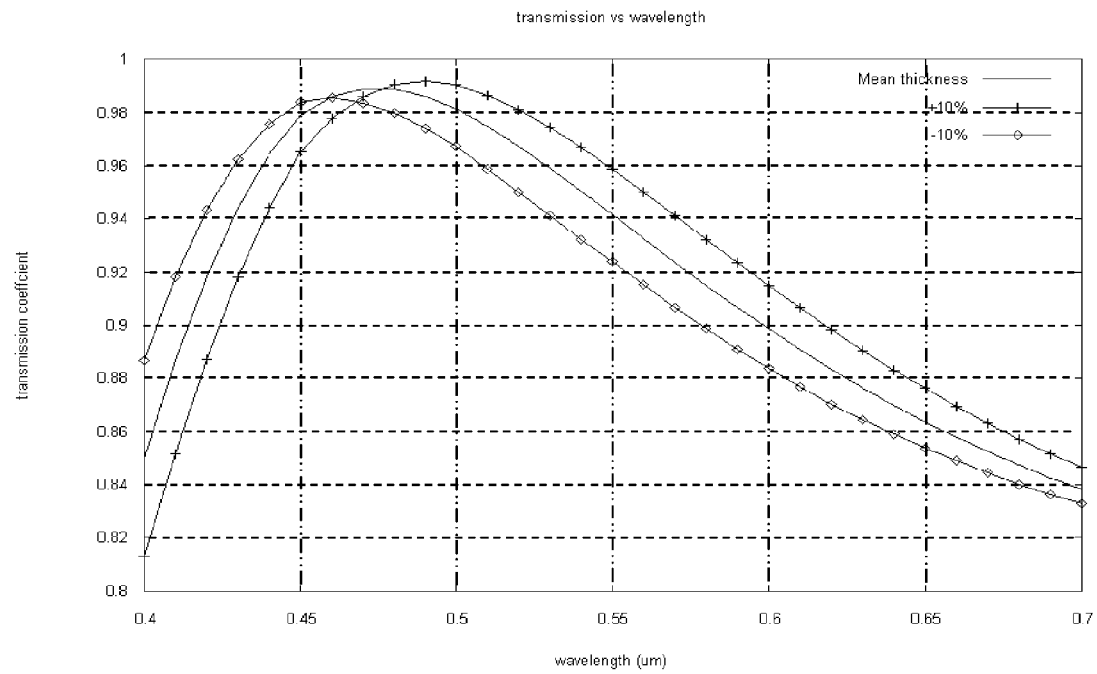
FIG. 13A is a graph of transmission coefficient versus light wavelength for an anti-reflection stack.

FIG. 13A is a graph of transmission coefficient versus light wavelength for the anti-reflection stack of FIG. 11 and FIG. 12E, for top AR film 236 (oxide) nominal thickness of 800 Angstroms, and varied +/−10%, whereas second AR film 234 (nitride) thickness is 500 Angstroms and third AR film 232 (oxide) thickness is 75 Angstroms. The transmission curves exhibit steep decline in the violet color region (400 nm to 450 nm). The nominal thicknesses of the AR films 232, 234, and 236 constituting the AR stack are chosen to position the maximum of the transmission curve in the blue color region (450 nm to 490 nm) instead of green color region (490 nm to 560 nm) so that any shift in film thicknesses due to manufacturing tolerance would not result in transmission coefficient fall-off much more in violet than in red color region (630 nm to 700 nm).

Figure 13B:
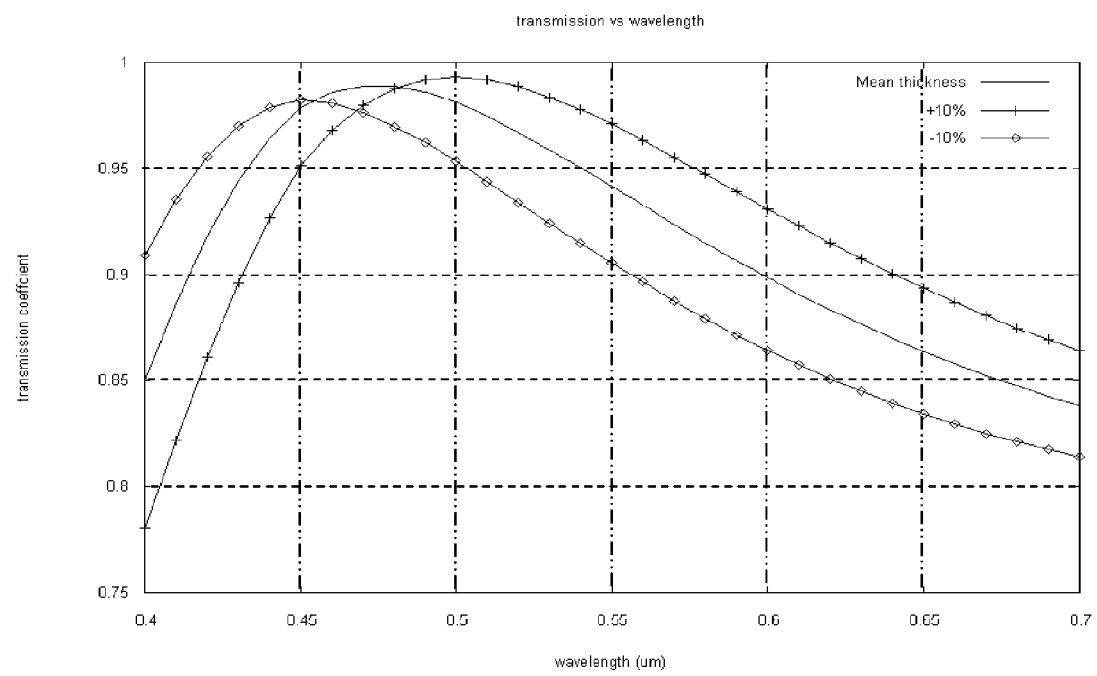
FIG. 13B is a graph of transmission coefficient versus light wavelength for the anti-reflection stack.

FIG. 13B is a graph of transmission coefficient versus light wavelength for the anti-reflection stack of FIG. 11 and FIG. 12E, for nominal second AR film (nitride) of 500 Angstroms thick, and varied +/−10%.

Figure 13C:
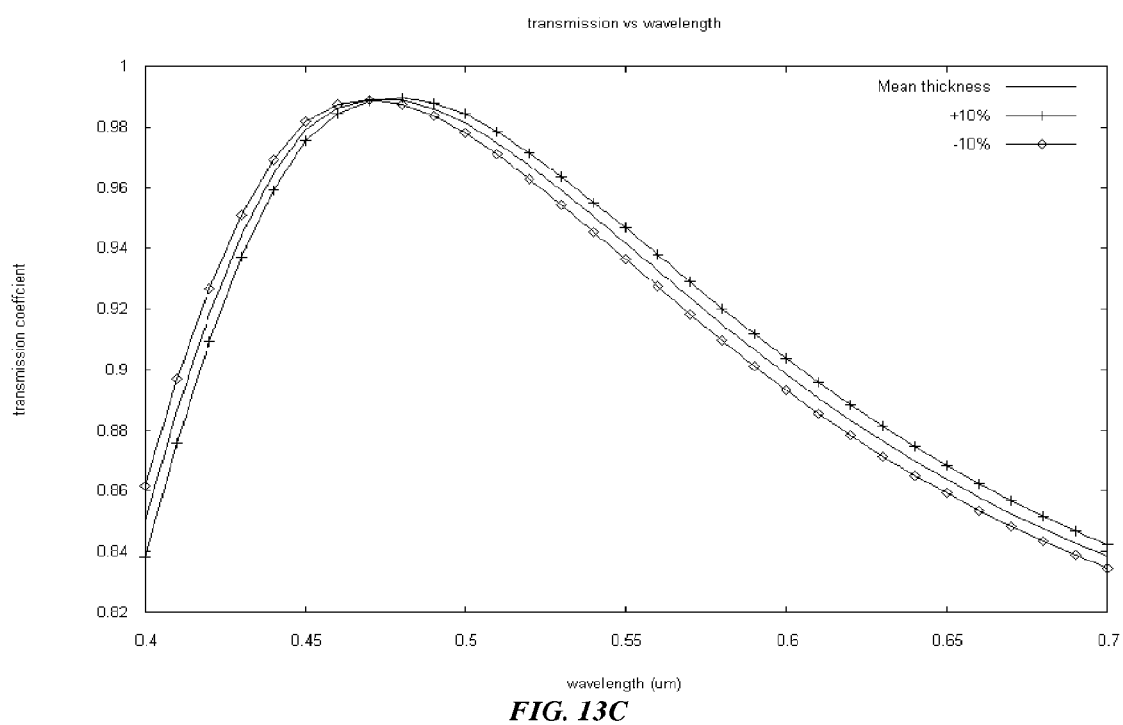
FIG. 13C is a graph of transmission coefficient versus light wavelength for the anti-reflection stack.

FIG. 13C is a graph of transmission coefficient versus light wavelength for the anti-reflection stack of FIG. 11 and FIG. 12E, for third AR film 232 (nitride) nominal thickness of 75 Angstroms, and varied +/−10%.

Figure 14A:
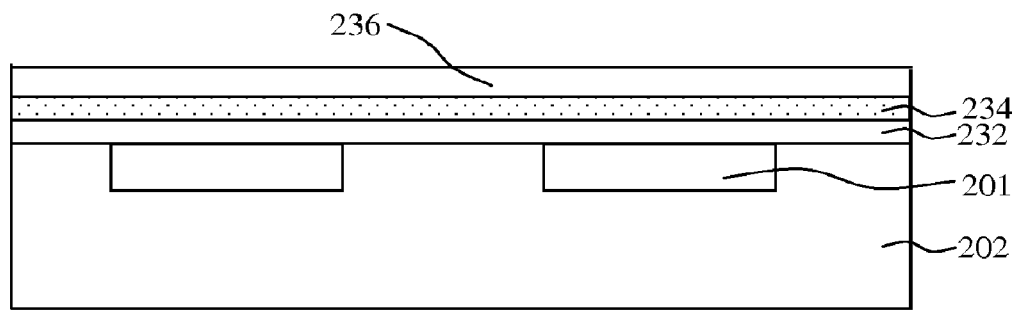
FIGS. 14A-G are illustrations showing an alternate process to form two anti-reflection stacks within the sensor.
Figure 14B:
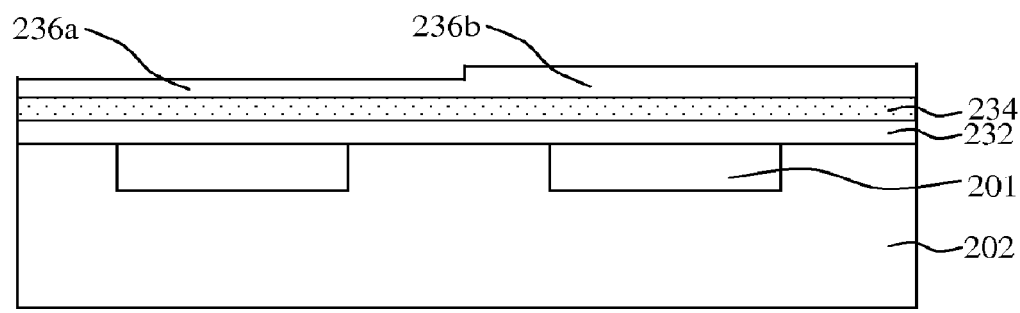
Figure 14C:
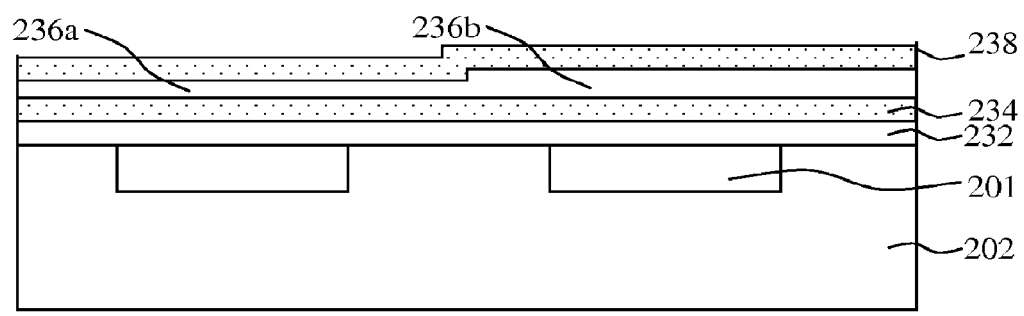
Figure 14D:
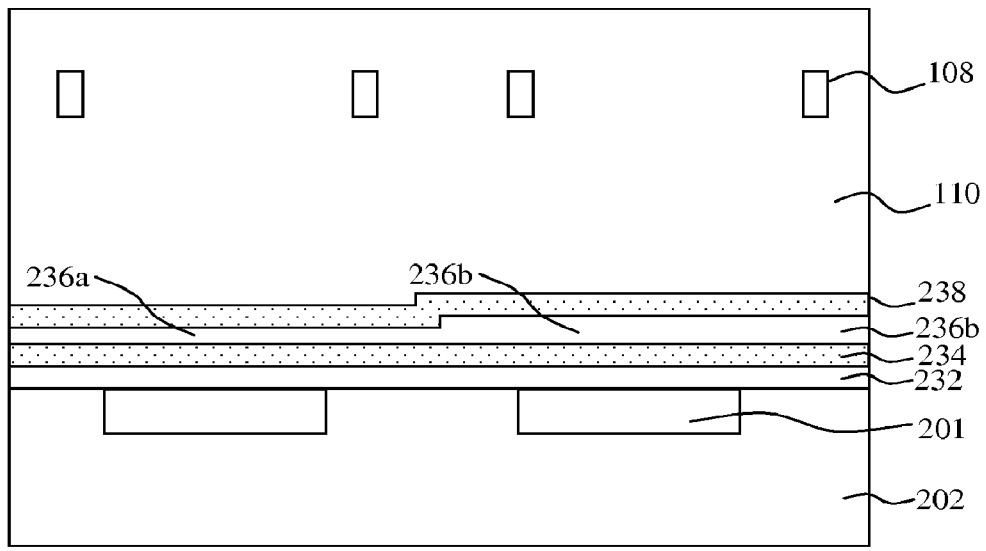
Figure 14E:
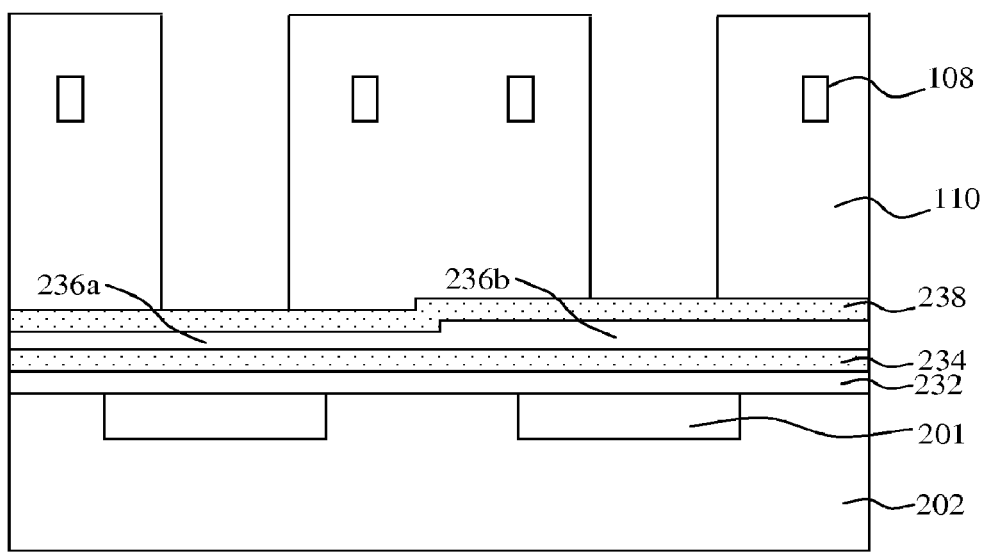
Figure 14F:
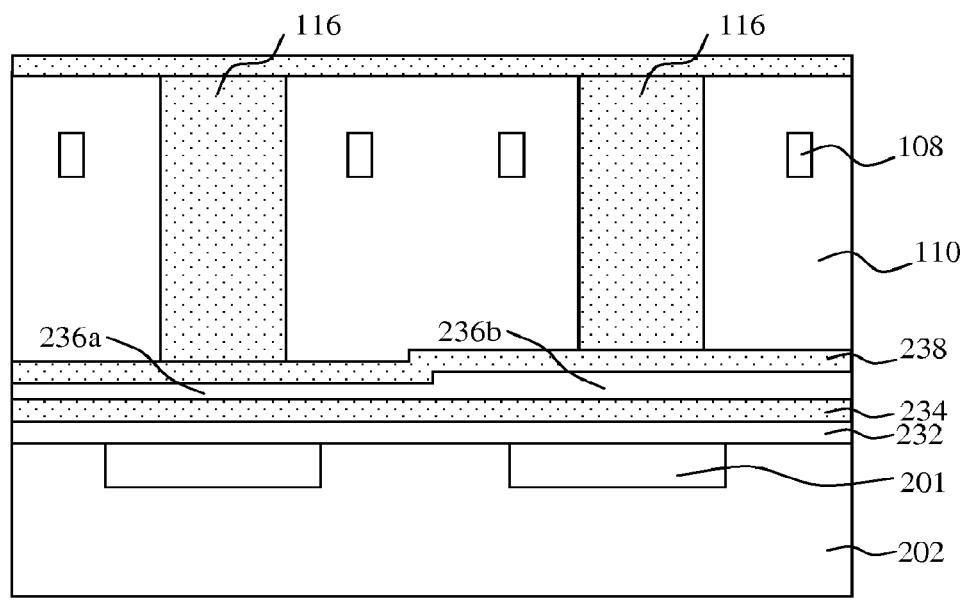

FIGS. 14A-G show a process for fabricating another embodiment of anti-reflection stack between the light guides 116 and substrate 202 to provide two different AR stacks at two different pixels that each optimizes for a different color region. Third and second AR film 232 and 234 are provided over the photoelectric conversion unit 201 in FIG. 14A, similar to the embodiment shown in FIG. 12A. In FIG. 14A, the top AR film 236 is deposited to the thickness of thicker top AR film 236b shown in FIG. 14B. Subsequently a lithography mask (not shown) is applied to create mask openings over the pixels that use the thinner top AR film 236a. An etch step is applied to thin the top AR film 236 under the mask opening to the smaller thickness of top AR film 236a in FIG. 14B. Subsequent steps, shown in FIGS. 14C to 14G, are similar to FIGS. 12B-E. Green color filters 114G is applied on the pixels having the thinner top AR film 236a, whereas Blue and Red color filters on the pixels having the thicker top AR film 236b.

Figure 14G:
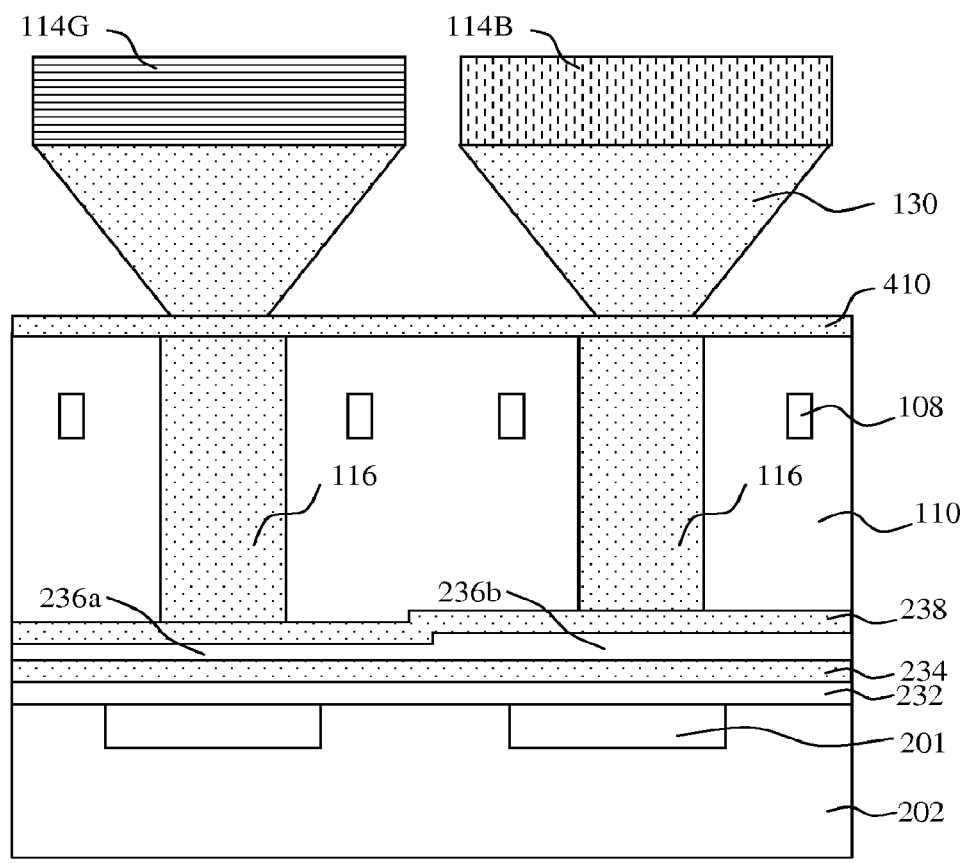
Figure 15A:
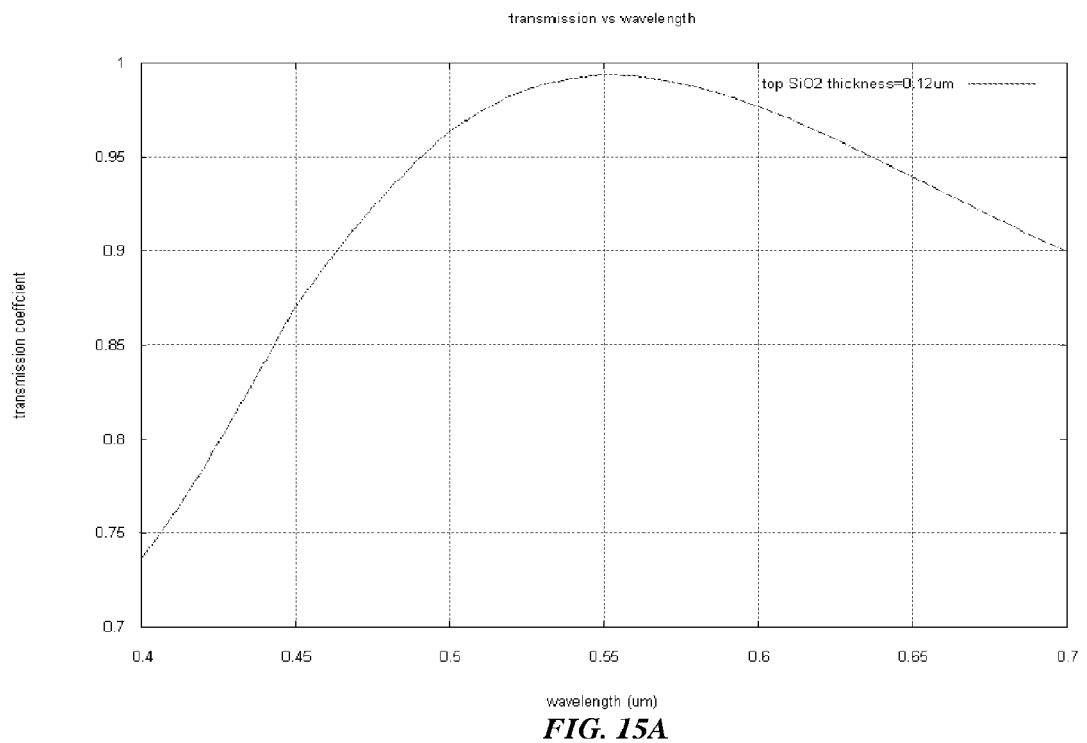
FIG. 15A is a graph of transmission coefficient versus light wavelength for a first anti-reflection stack on a left hand portion of FIG. 14G.

FIG. 15A is a graph of transmission coefficient versus light wavelength for the anti-reflection stack of FIG. 14G for a nominal thinner top AR film 236a of nominal thickness 0.12 um, a second AR film 234 of nominal thickness 500 Angstroms, and a third AR film 232 of nominal thickness 75 Angstroms. This graph peaks in the green color region at approximately 99%, and drops gently to approximately 93% at the center of the red color region. This graph shows that the top AR film 236a can be used at red pixels as well as green pixels.

Figure 15B:
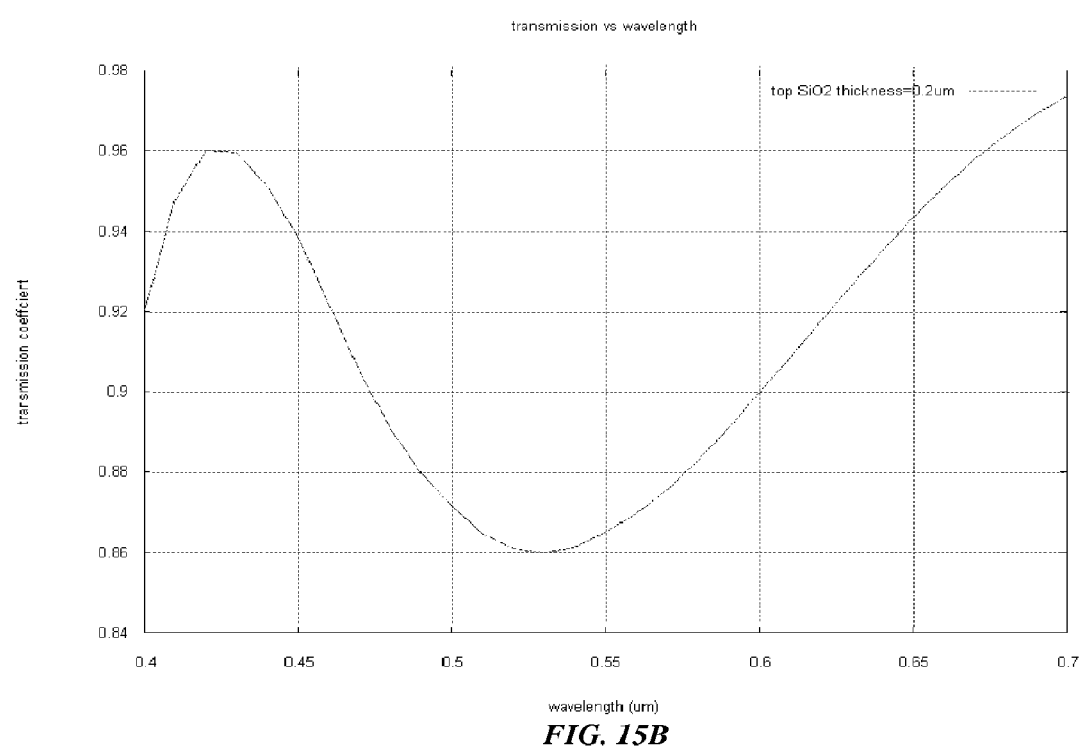
FIG. 15B is a graph of transmission coefficient versus light wavelength for a second anti-reflection stack shown on a right hand portion of FIG. 14G.

FIG. 15B is a graph of transmission coefficient versus light wavelength for the anti-reflection stack of FIG. 14G for a top AR film 236b of nominal thickness 0.20 um, a second AR film 234 of nominal thickness 500 Angstroms, and a third AR film 232 of nominal thickness 75 Angstroms. This graph peaks in two separate color regions, viz. purple and red. This graph shows that the top AR film 236b can be used at blue pixels and red pixels.

A pixel array may use the thinner top AR film 236a for green pixels only while the thicker top AR film 236b for both blue and red pixels. Alternately, the pixel array may use the thinner top AR film 236a for both green and red pixels while the thicker top AR film 236b for blue pixels only.

Another embodiment to provide two different AR stacks that each optimizes for a different color region can be provided by creating different second AR film thicknesses while keeping the same top AR film thickness. Two different thicknesses are determined, one for each color region. The second AR film is first deposited to the larger thickness. Subsequently a lithography mask is applied to create a mask opening over the pixels that uses the smaller second AR film thickness. An etching step is applied to thin the second AR film under the mask opening to the smaller thickness. Subsequent steps are identical to FIGS. 12B-E.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An image sensor that comprises a pixel array, comprising:
   a substrate;
   a plurality of photoelectric conversion units across said substrate; and,
   a plurality of color filters, each of the plurality of color filters being coupled to transmit a light to one of the plurality of photoelectric conversion units, an air gap being between each of the plurality of color filters and an adjacent one of the plurality of color filters, said air gap comprising air or a gas, said air gap having a width of 0.45 um or less.

2. The image sensor of claim 1, wherein said air gap has a depth of at least a wavelength in air of a visible light.

3. The image sensor of claim 2, wherein said wavelength in air is 650 nm.

4. The image sensor of claim 1, further comprising:
   a plurality of light guides each one of which is disposed between one of the plurality of color filters and a corresponding one of the plurality of photoelectric conversion units.

5. The image sensor of claim 4, wherein each one of the plurality of light guides comprises a silicon nitride.

6. The image sensor of claim 4, wherein no microlens is arranged to transmit light to any one of the plurality of color filters.

7. The image sensor of claim 1, wherein the width is more than 0.2 um.

8. The image sensor of claim 1, wherein a protection film with a non-zero thickness extends over the plurality of photoelectric conversion units and under the plurality of color filters.

9. The image sensor of claim 8, wherein the protection film comprises a silicon nitride.

10. The image sensor of claim 9, wherein the protection films has a thickness between 4,000 and 10,000 Angstroms.

11. The image sensor of claim 4, wherein a portion of each light guide from the plurality of light guides is narrower than another portion of said each light guide, the narrower portion being nearer to the corresponding photoelectric conversion unit than the other portion.

12. The image sensor of claim 4, wherein the plurality of light guides is embedded between a plurality of wires.

13. The image sensor of claim 1, further comprising:
   a film disposed on the substrate and below the plurality of color filters to reduce reflection of light from the substrate.

14. The image sensor of claim 1, wherein a refractive index changes across an interface of each one of the plurality of color filters facing the substrate.

* * * * *